United States Patent
Pao et al.

(10) Patent No.: US 11,329,042 B2
(45) Date of Patent: May 10, 2022

(54) GATE STRUCTURES HAVING NEUTRAL ZONES TO MINIMIZE METAL GATE BOUNDARY EFFECTS AND METHODS OF FABRICATING THEREOF

(71) Applicant: Taiwan Semiconductor Manufacturing Co., Ltd., Hsin-Chu (TW)

(72) Inventors: Chia-Hao Pao, Kaohsiung (TW); Chih-Hsuan Chen, Hsinchu (TW); Lien Jung Hung, Taipei (TW); Shih-Hao Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/678,695

(22) Filed: Nov. 8, 2019

(65) Prior Publication Data

US 2020/0176447 A1    Jun. 4, 2020

Related U.S. Application Data

(60) Provisional application No. 62/773,549, filed on Nov. 30, 2018.

(51) Int. Cl.
*H01L 27/092* (2006.01)
*H01L 29/78* (2006.01)
(Continued)

(52) U.S. Cl.
CPC .... *H01L 27/0924* (2013.01); *H01L 21/82385* (2013.01); *H01L 21/823821* (2013.01);
(Continued)

(58) Field of Classification Search
None
See application file for complete search history.

(56) References Cited

U.S. PATENT DOCUMENTS

| 8,703,595 B2 | 4/2014 | Chuang et al. |
| 9,640,540 B1 | 5/2017 | Liaw |

(Continued)

FOREIGN PATENT DOCUMENTS

| KR | 20130086937 A | 8/2013 |
| KR | 20150071637 A | 6/2015 |

(Continued)

*Primary Examiner* — Nilufa Rahim
(74) *Attorney, Agent, or Firm* — Haynes and Boone, LLP

(57) ABSTRACT

Gate structures having neutral zones to minimize metal gate boundary effects and methods of fabricating thereof are disclosed herein. An exemplary metal gate includes a first portion, a second portion, and a third portion. The second portion is disposed between the first portion and the third portion. The first portion includes a first gate dielectric layer, a first p-type work function layer, and a first n-type work function layer. The second portion includes a second gate dielectric layer and a second p-type work function layer. The third portion includes a third gate dielectric layer, a third p-type work function, and a second n-type work function layer. The second p-type work function layer separates the first n-type work function layer from the second n-type work function layer, such that the first n-type work function layer does not share an interface with the second n-type work function layer.

21 Claims, 25 Drawing Sheets

(51) Int. Cl.
*H01L 29/66* (2006.01)
*H01L 21/8238* (2006.01)
*H01L 29/423* (2006.01)

(52) U.S. Cl.
CPC .. *H01L 21/823842* (2013.01); *H01L 29/4236* (2013.01); *H01L 29/4238* (2013.01); *H01L 29/66545* (2013.01); *H01L 29/66795* (2013.01); *H01L 29/785* (2013.01); *H01L 27/092* (2013.01)

(56) References Cited

U.S. PATENT DOCUMENTS

| | | |
|---|---|---|
| 2013/0299914 A1 | 11/2013 | Kim |
| 2014/0124873 A1 | 5/2014 | Jagannathan et al. |
| 2017/0236821 A1* | 8/2017 | Kim ................. H01L 27/088 257/401 |
| 2017/0365527 A1 | 12/2017 | Zhou et al. |
| 2018/0019242 A1 | 1/2018 | Liao et al. |
| 2018/0151573 A1* | 5/2018 | Li .................. H01L 29/4966 |
| 2019/0371933 A1* | 12/2019 | Chen ............... H01L 29/41791 |
| 2020/0006341 A1* | 1/2020 | Hong ............. H01L 21/823828 |
| 2020/0118889 A1* | 4/2020 | Bao ................ H01L 27/0922 |
| 2020/0144420 A1* | 5/2020 | Steigerwald ...... H01L 29/78645 |
| 2020/0388707 A1* | 12/2020 | Shen ............... H01L 21/28088 |
| 2021/0028291 A1* | 1/2021 | Park ............... H01L 29/4966 |

FOREIGN PATENT DOCUMENTS

| | | |
|---|---|---|
| KR | 20170059247 A | 5/2017 |
| TW | 201614717 A | 4/2016 |
| TW | 201633383 A | 9/2016 |
| TW | 201725612 A | 7/2017 |
| TW | 201820450 A | 6/2018 |

* cited by examiner

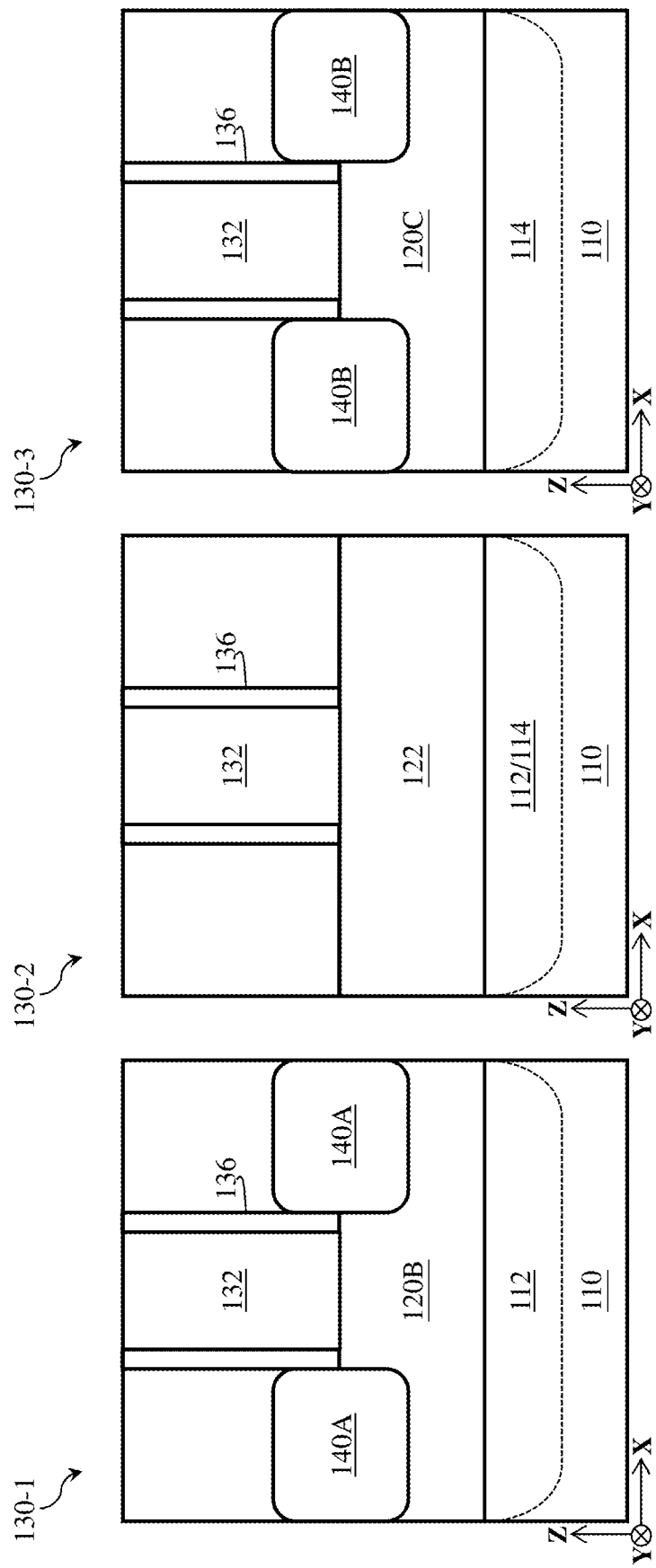

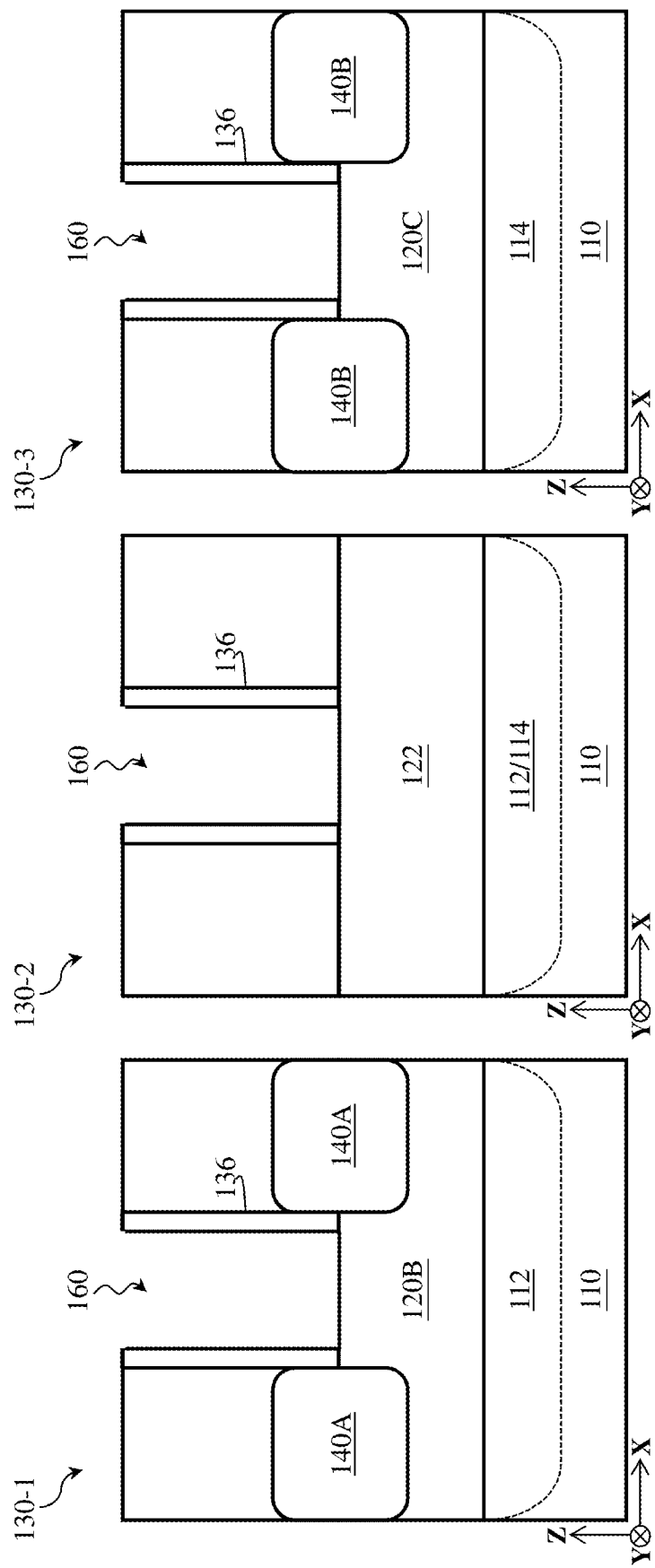

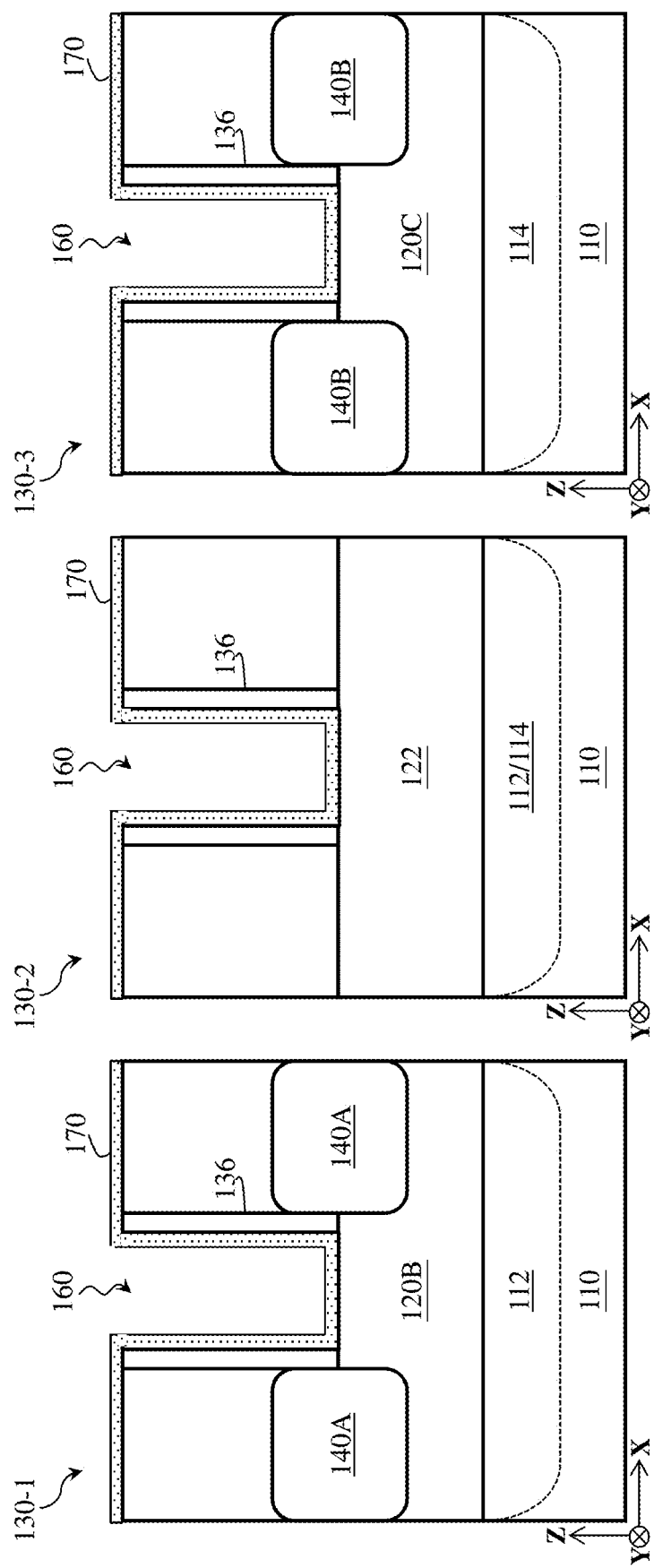

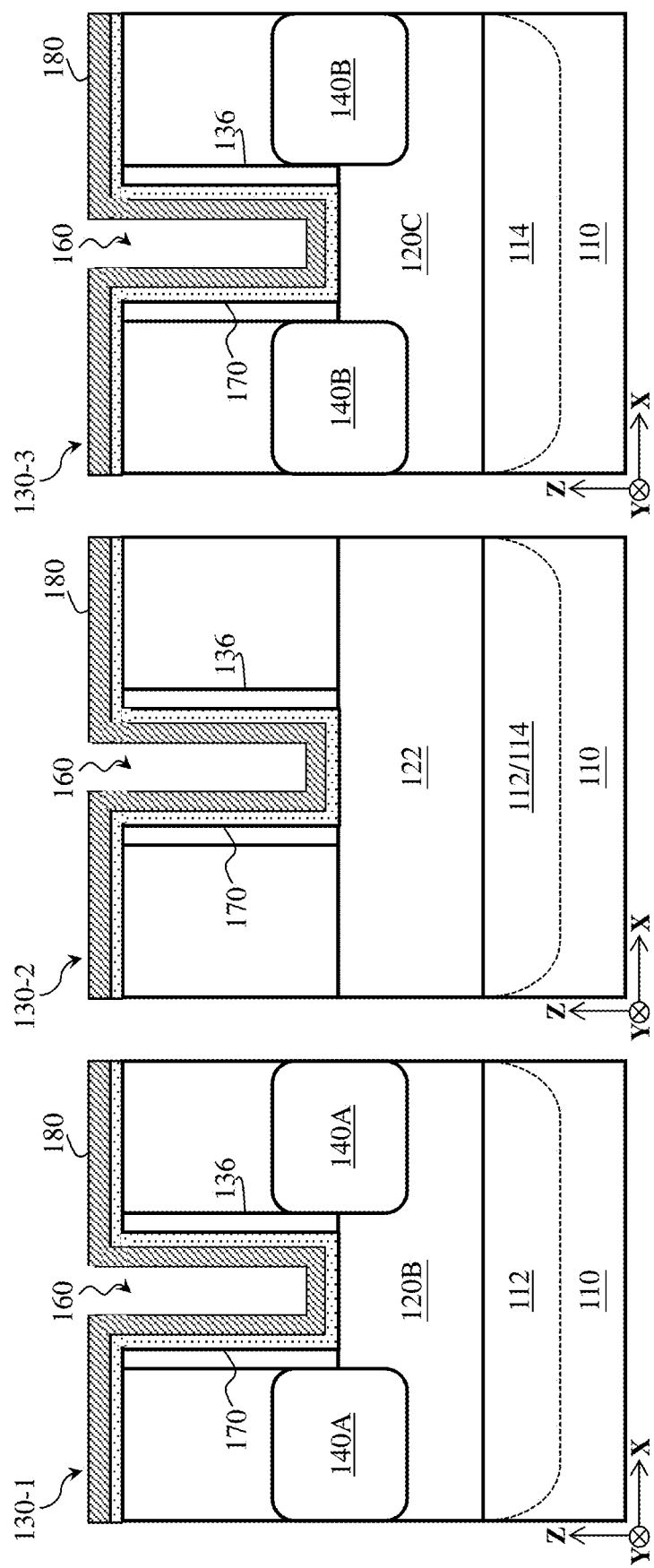

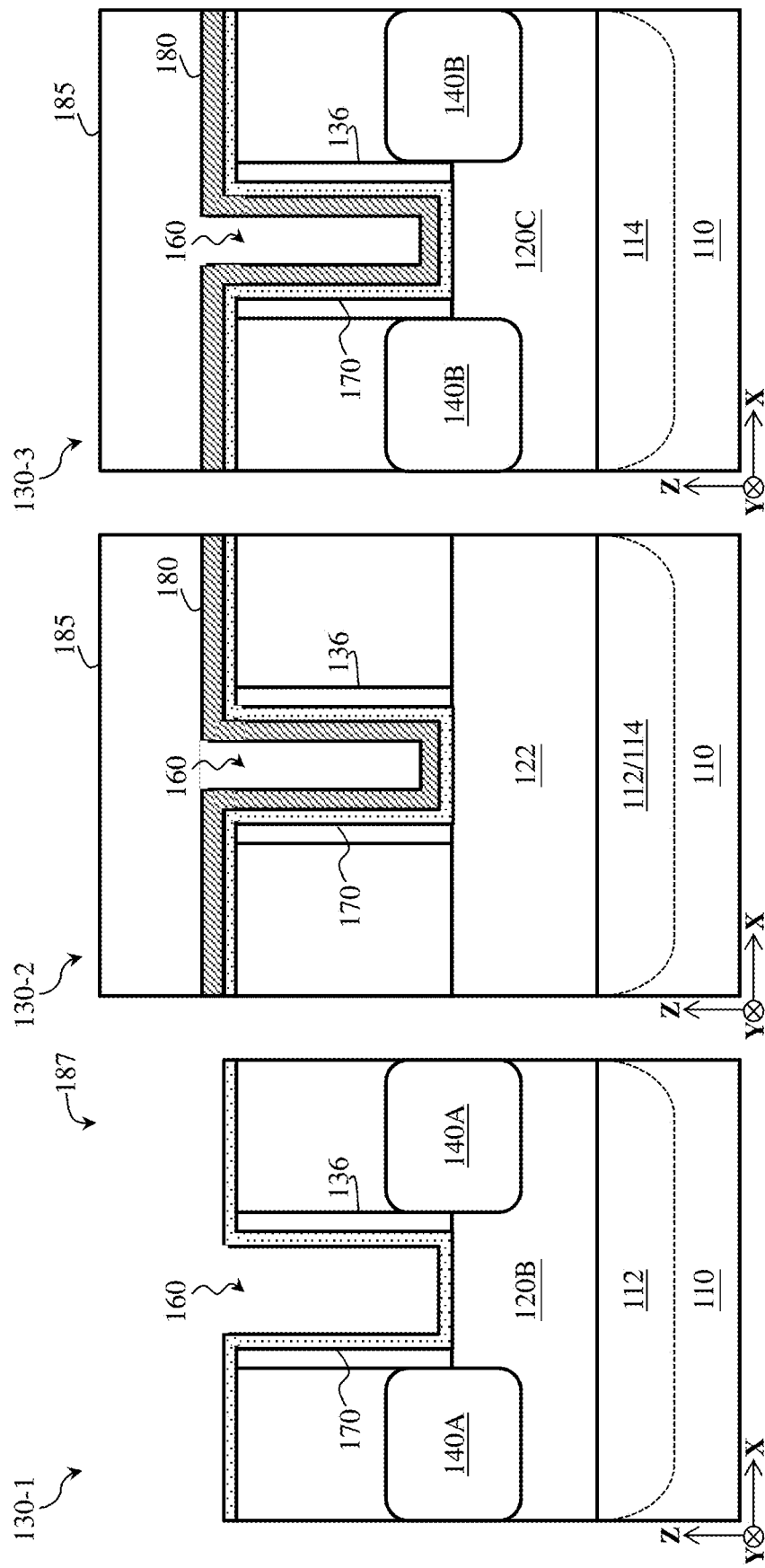

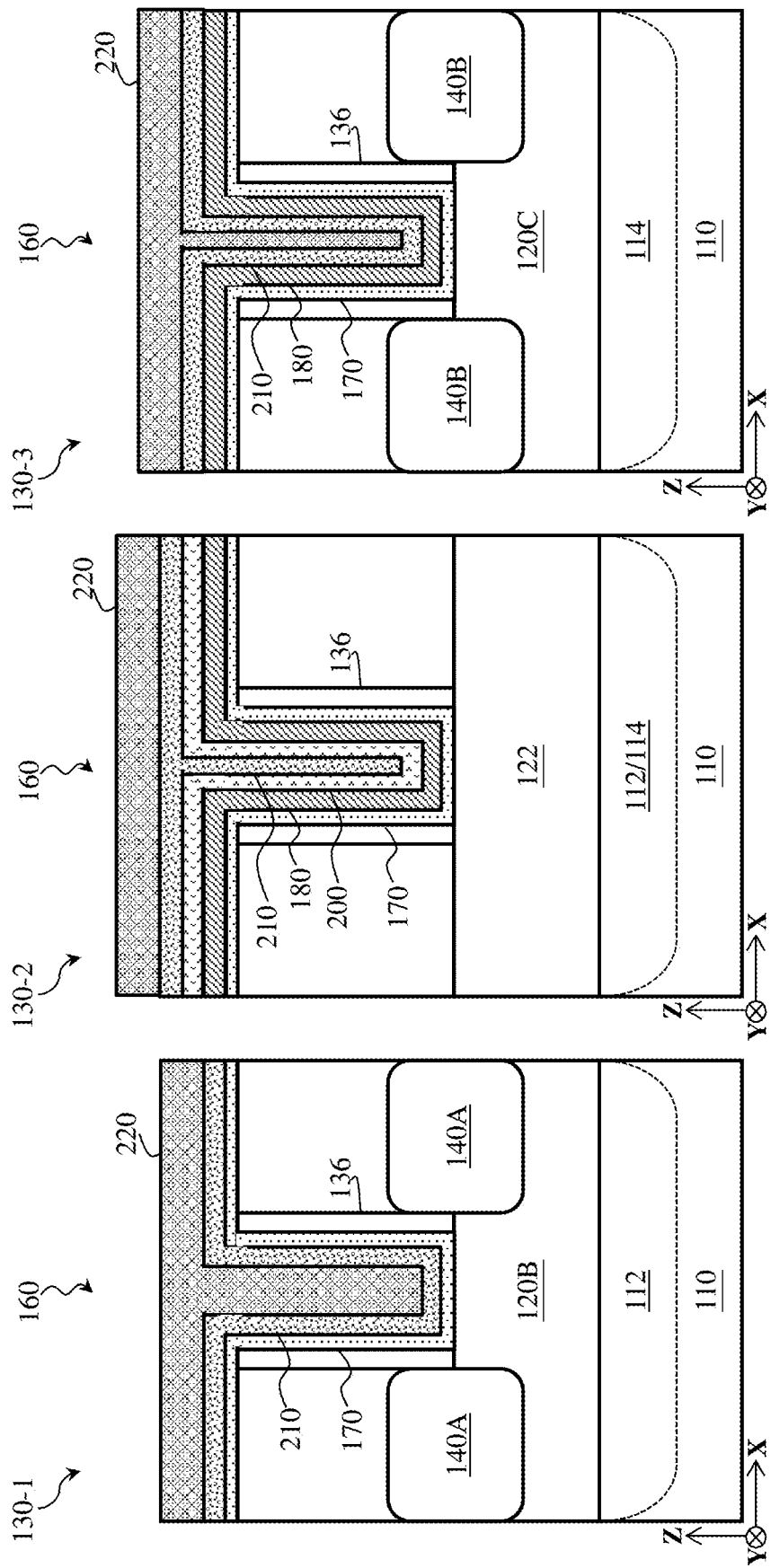

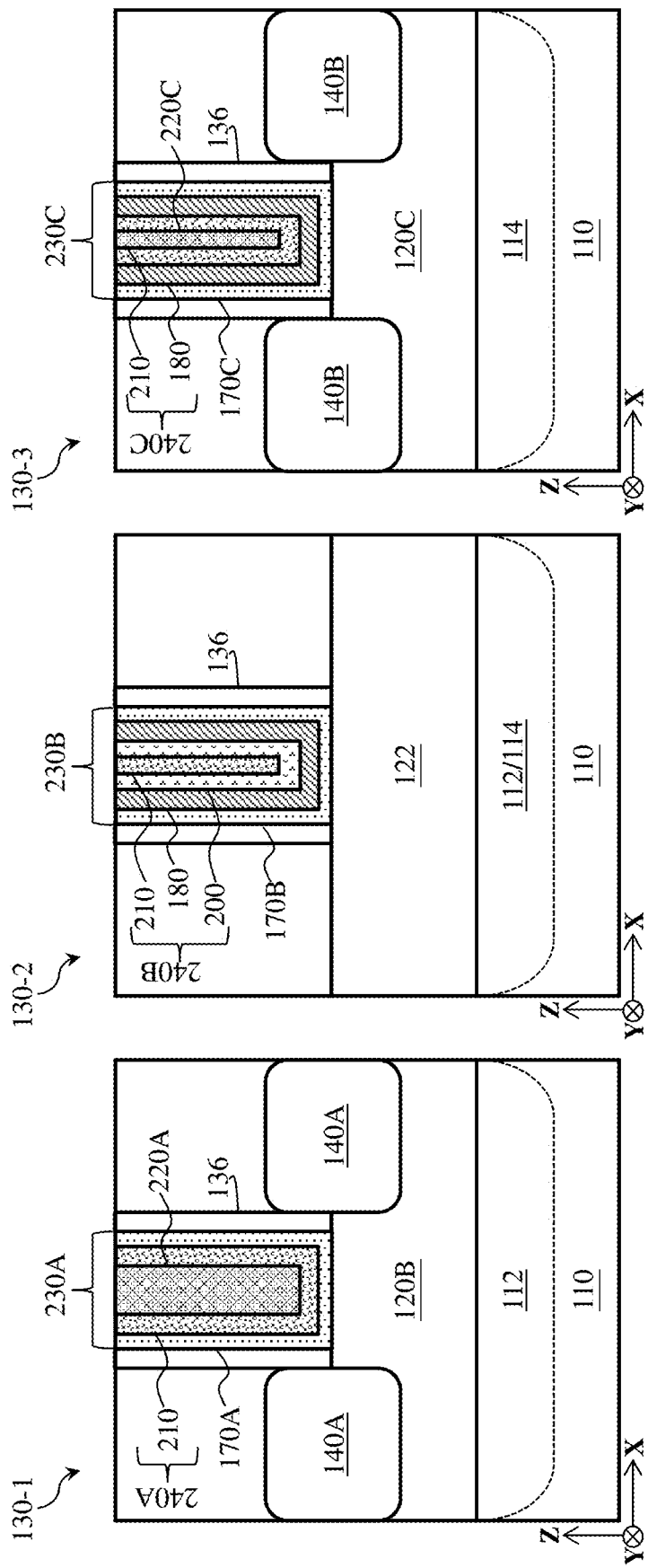

GATE STRUCTURES HAVING NEUTRAL ZONES TO MINIMIZE METAL GATE BOUNDARY EFFECTS AND METHODS OF FABRICATING THEREOF

The present application is a non-provisional application of and claims benefit of U.S. Patent Application Ser. No. 62/773,549, filed Nov. 30, 2018, the entire disclosure of which is incorporated herein by reference.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, to facilitate dense packing of IC features required for advanced IC technology nodes, a metal gate can be configured with different work functions to enable transistors with different threshold voltages, such as a p-type transistor and an n-type transistor. This results in a metal gate of the p-type transistor (a first metal gate portion configured with a first work function) sharing an interface (or boundary) with a metal gate of the n-type transistor (a second metal gate portion configured with a second work function). It has been observed that metal diffusion across the interface can cause variations in the desired threshold voltages of the p-type transistor and the n-type transistor, which variations are exacerbated as IC feature sizes shrink. Accordingly, although existing metal gate fabrication techniques and resulting metal gates have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A-11A, FIGS. 2B-11B, FIGS. 2C-11C, and FIGS. 2D-11D are fragmentary diagrammatic views of an integrated circuit device, in portion or entirety, at various fabrication stages (such as those associated with the method in FIG. 1) according to various aspects of the present disclosure.

DETAILED DESCRIPTION

Figure 1:
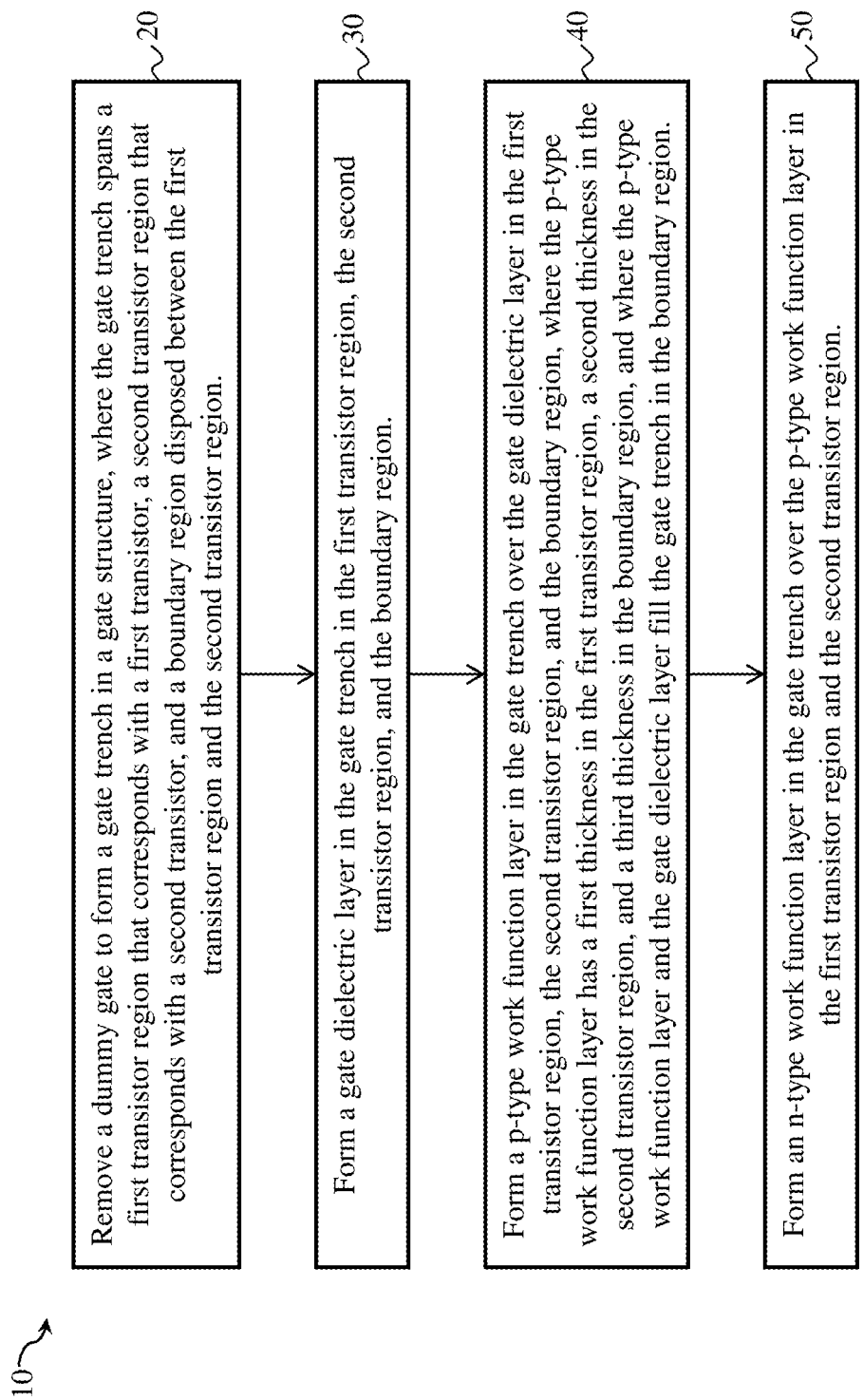
FIG. 1 is a flow chart of a method for fabricating an integrated circuit device according to various aspects of the present disclosure.
Figure 2A:
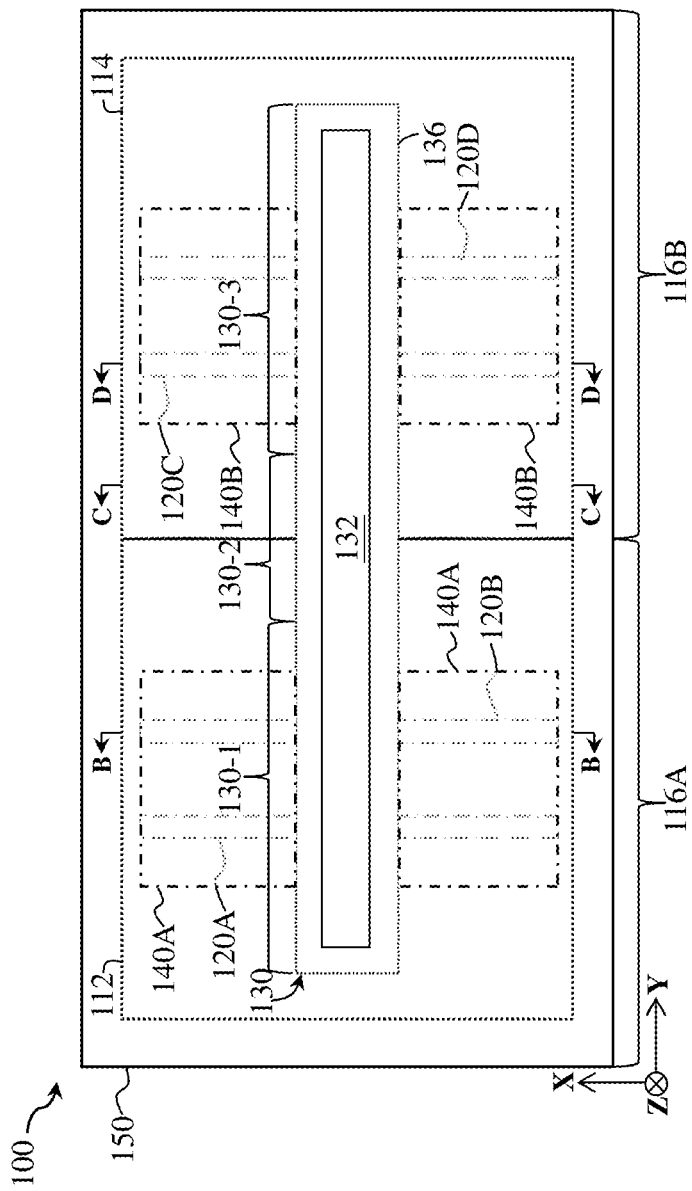
Figure 3A:
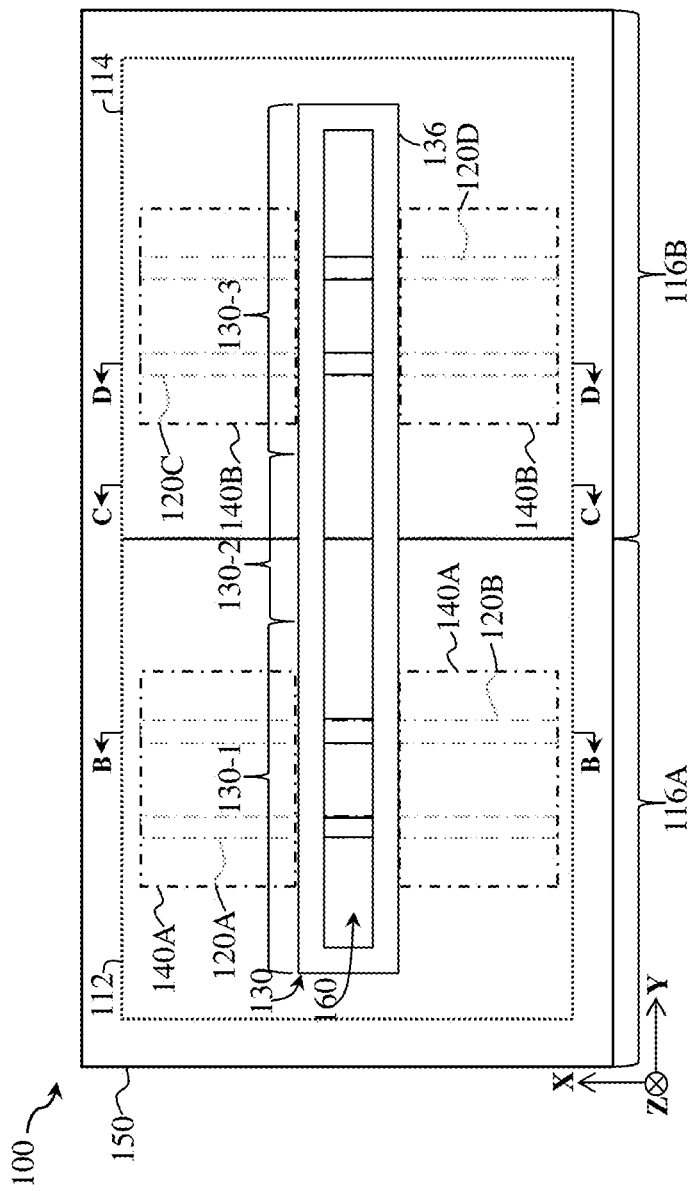
Figure 4A:
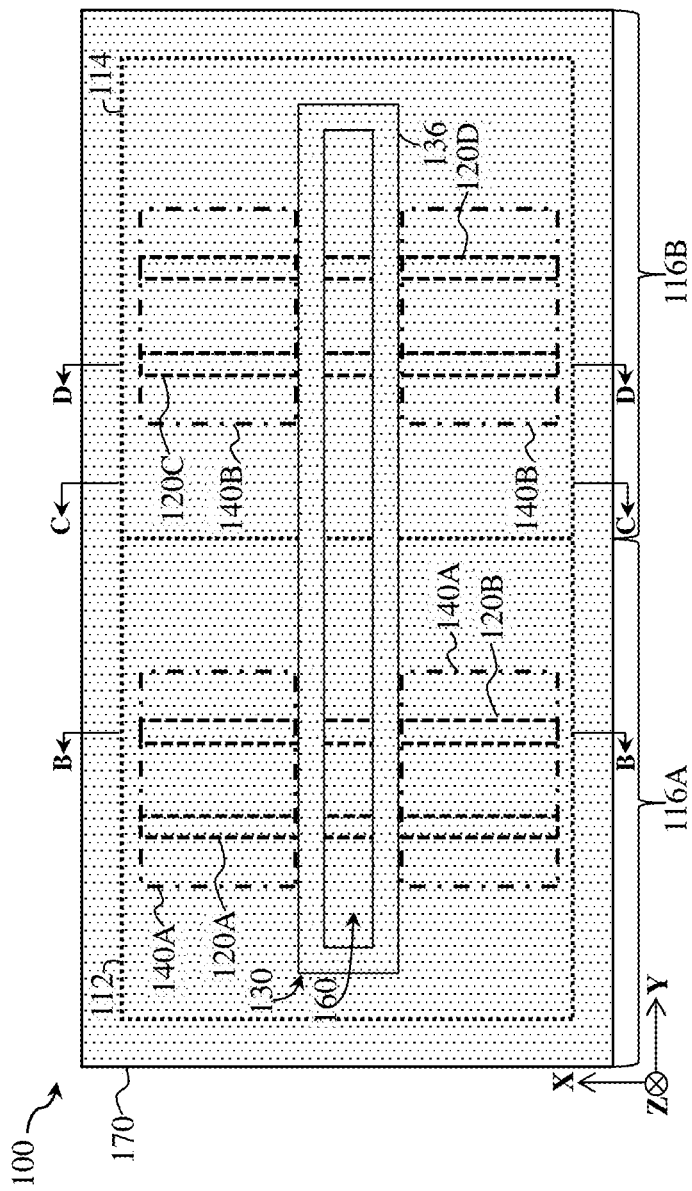
Figure 5A:
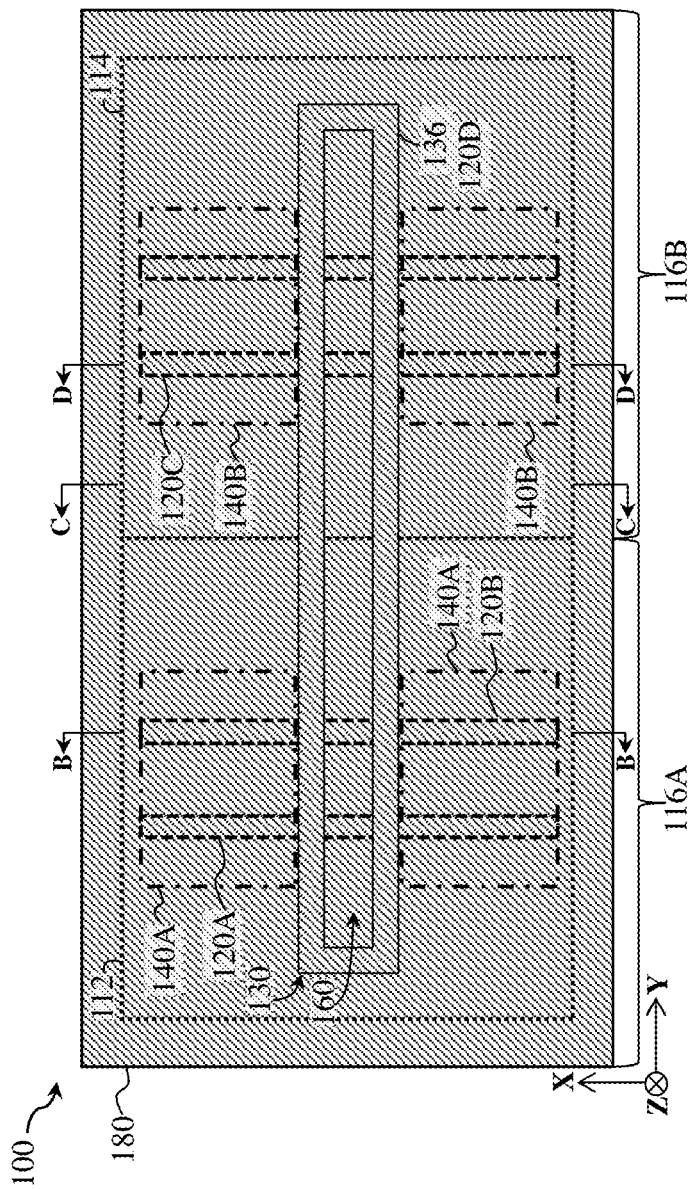
Figure 6A:
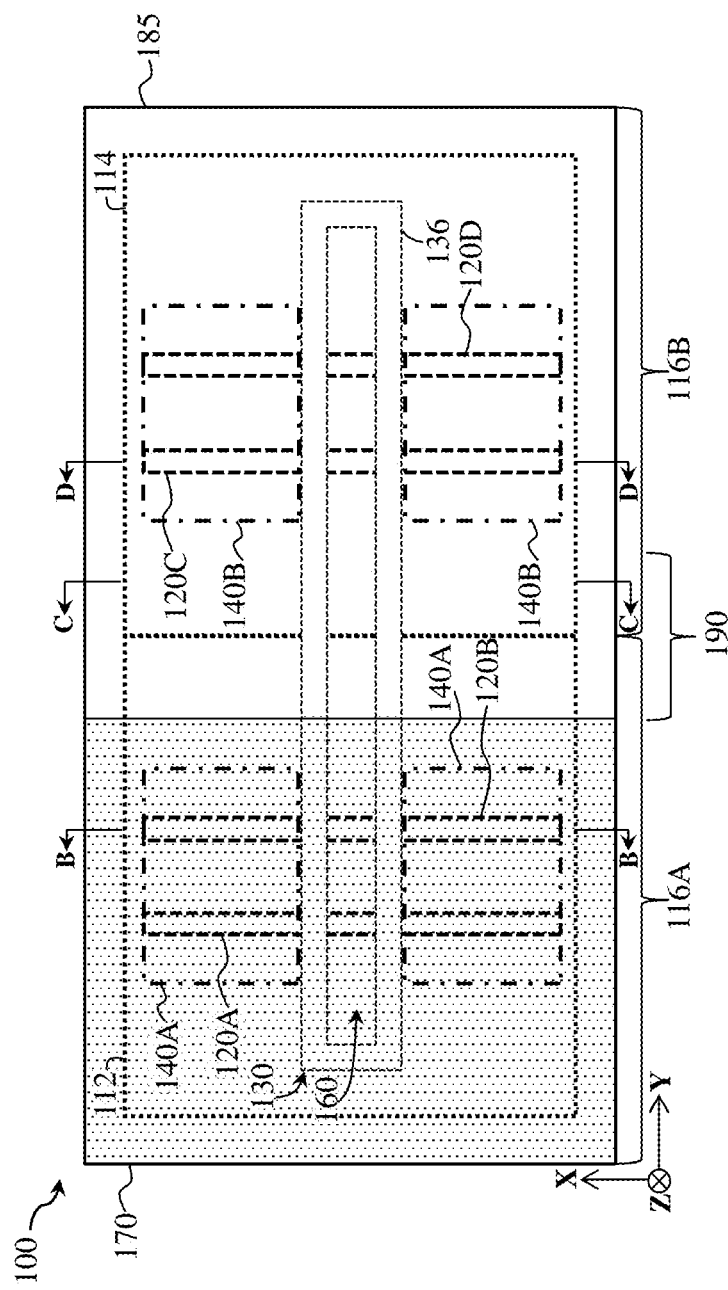
Figure 7A:
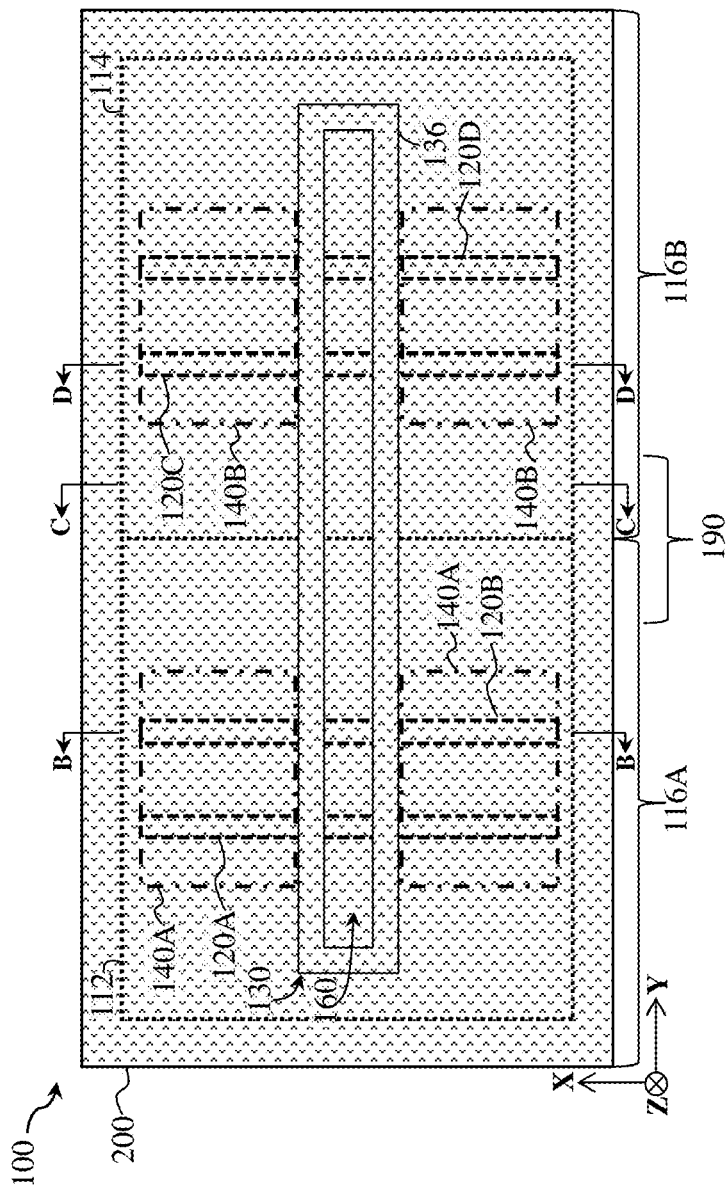
Figures 7B, 7C, 7D:
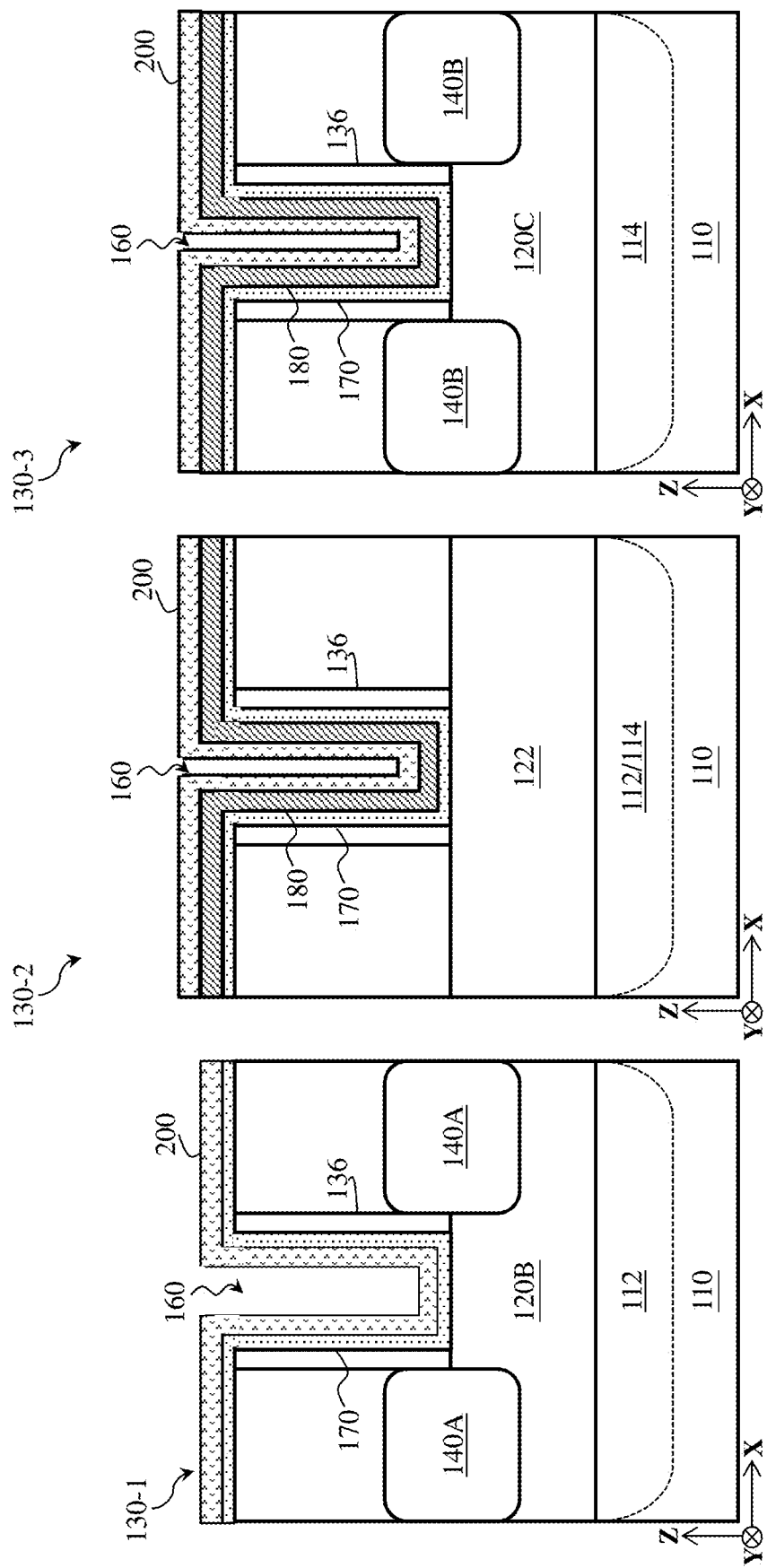
Figure 8A:
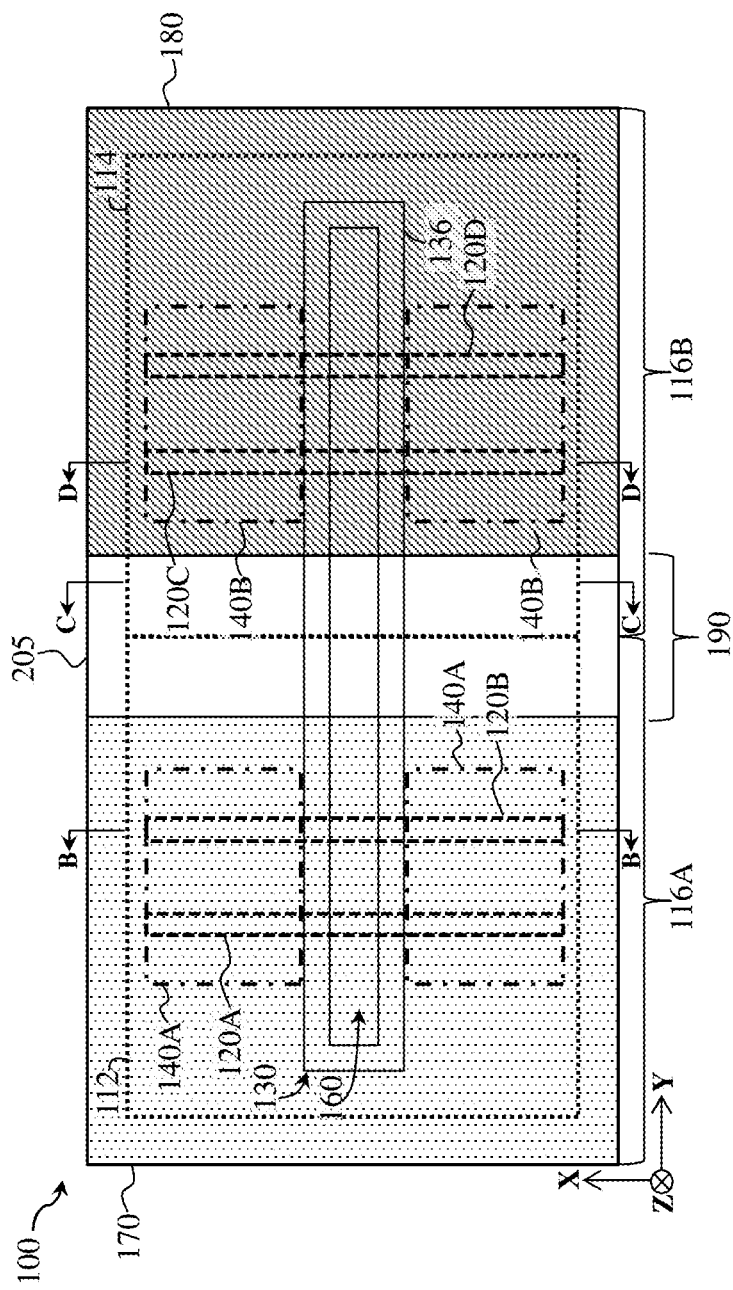
Figures 8B, 8C, 8D:
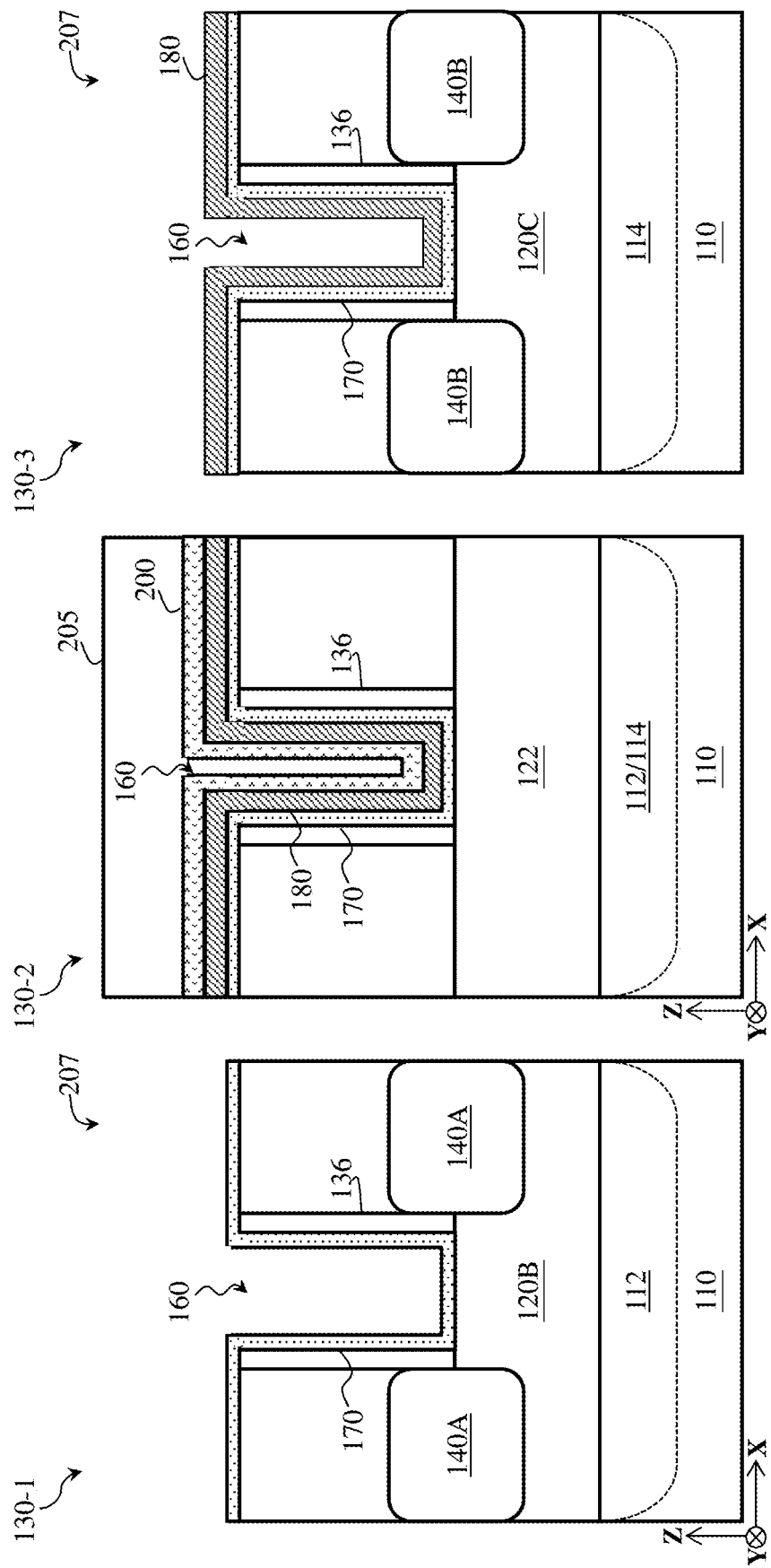
Figure 9A:
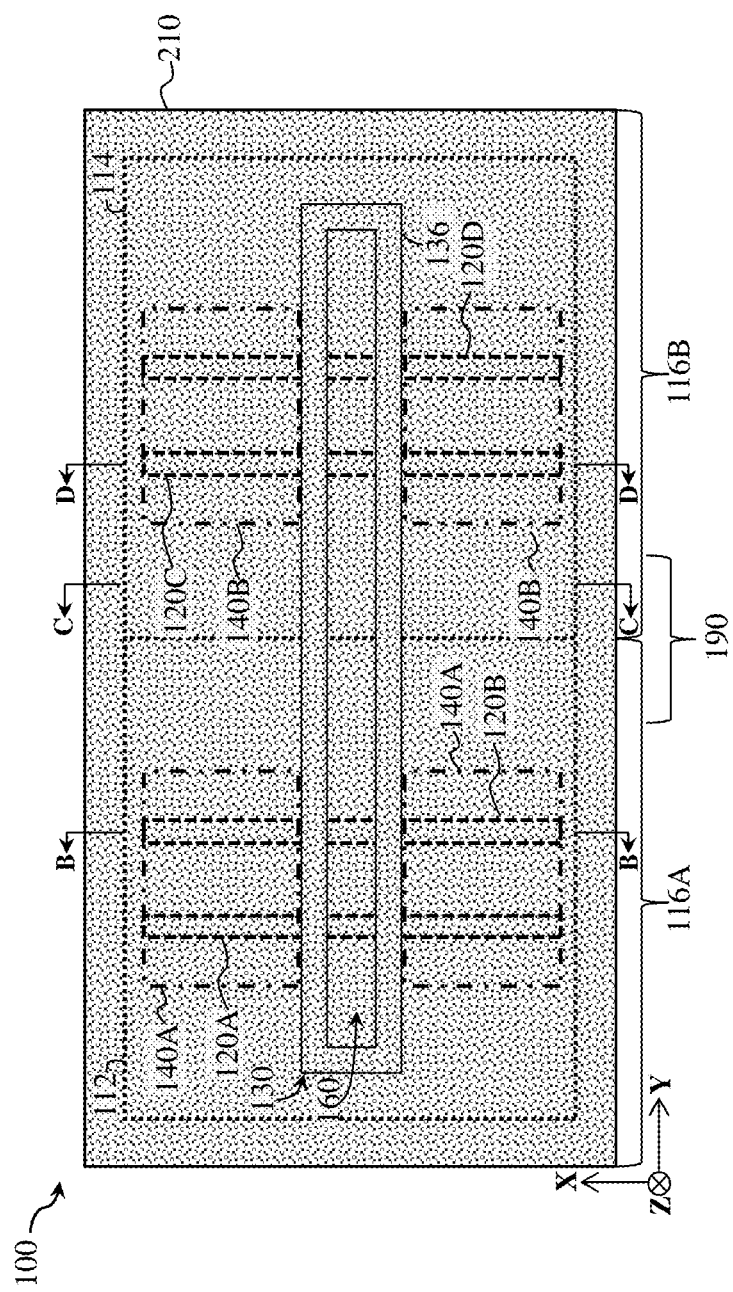
Figures 9B, 9C, 9D:
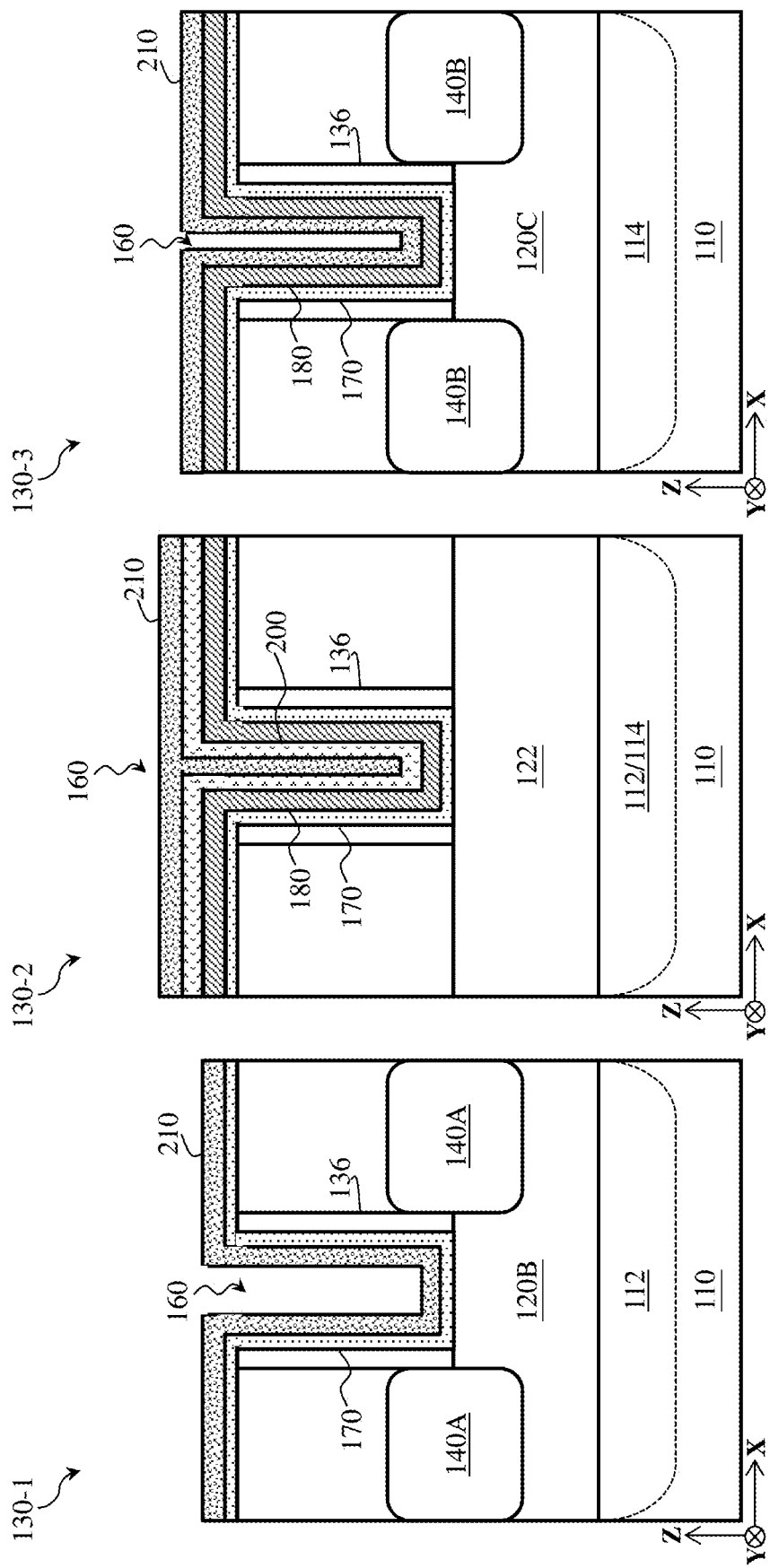
Figure 10A:
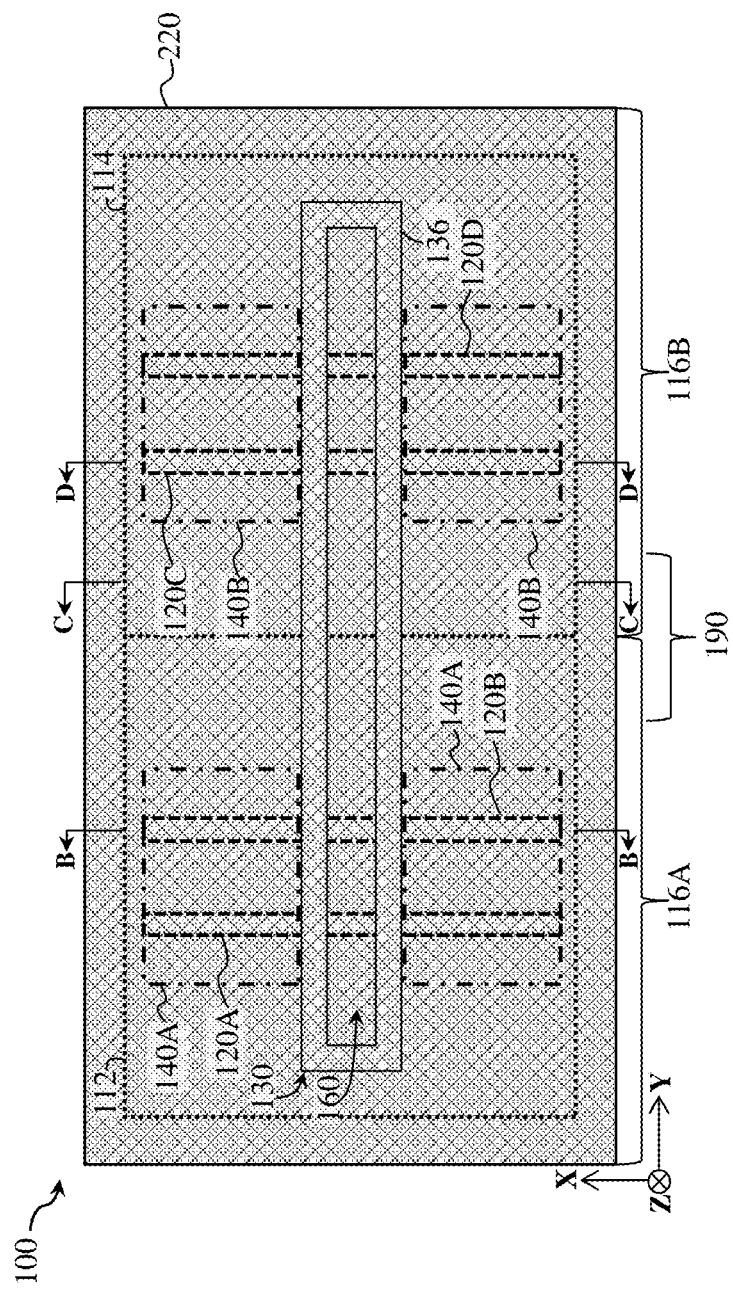
Figure 11A:
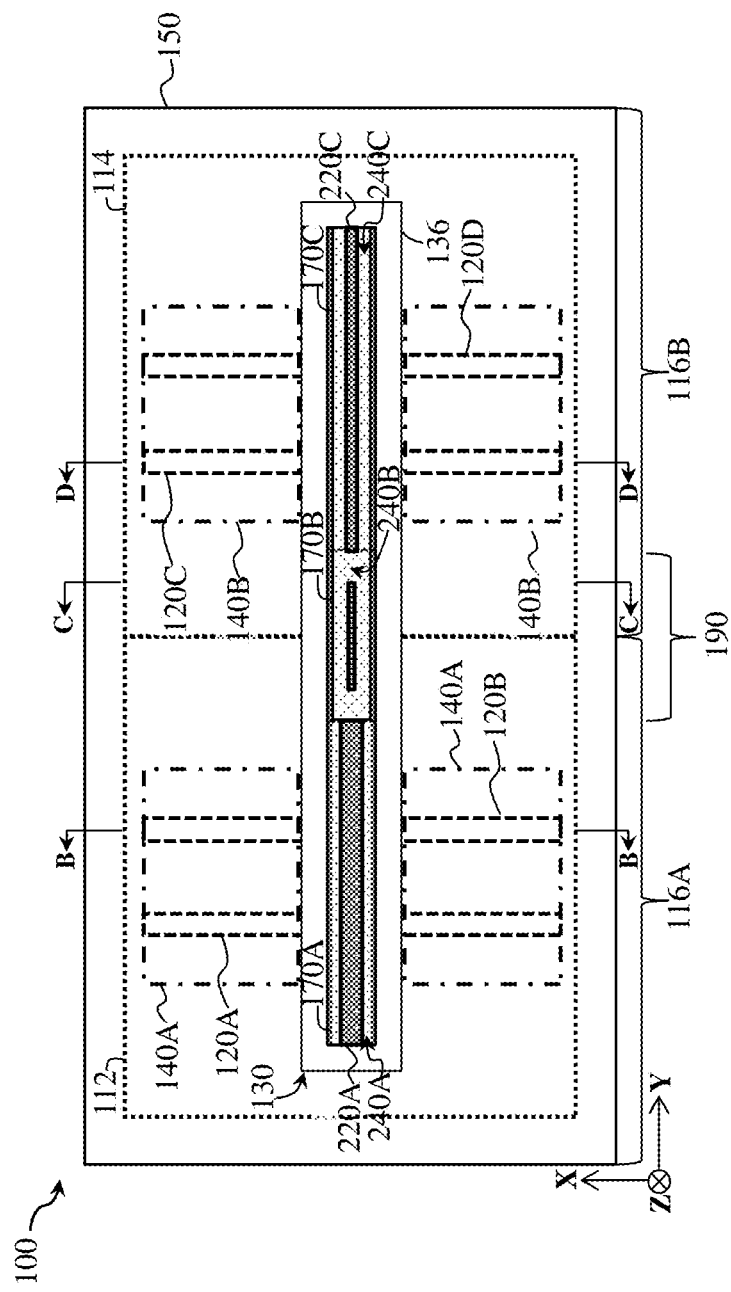

The present disclosure relates generally to integrated circuit (IC) devices, and more particularly, to gate structures for IC devices, such as fin-like field effect transistors (FinFETs), and methods of fabricating thereof.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Integrated circuits (ICs) often implement gate structures that span transistors having different threshold voltages. For example, an IC device may include a p-type FinFET disposed adjacent to an n-type FinFET, where a gate structure spanning the p-type FinFET and the n-type FinFET includes a first metal gate configured for the p-type FinFET (referred to hereafter as the p-type FinFET's metal gate) and a second metal gate configured for the n-type FinFET (referred to hereafter as the n-type FinFET's metal gate). In such configurations, the p-type FinFET's metal gate and the n-type FinFET's metal gate share an interface or boundary (referred to hereafter as an n/p (or p/n) boundary). Though the p-type FinFET and the n-type FinFET are configured to operate independently, metal diffusion across the n/p boundary has been observed to undesirably shift threshold voltages of the p-type FinFET and/or the n-type FinFET. For example, aluminum from the n-type FinFET's metal gate diffusing across the n/p boundary to the p-type FinFET's metal gate can increase a threshold voltage of the p-type FinFET. In some instances, the threshold voltage of the p-type FinFET is higher than a threshold voltage of a similarly configured p-type FinFET having a metal gate that does not border a metal gate of an n-type FinFET. Such n/p boundary effects are exacerbated as FinFET sizes continue to shrink to meet demands of advanced IC technology nodes. Improvements are thus needed.

The present disclosure proposes implementing a neutral zone (area) in a gate structure between the p-type FinFET's metal gate and the n-type FinFET's metal gate. The neutral zone of the gate structure is configured to eliminate (or impede) a metal diffusion path, such as an aluminum diffusion path, between the p-type FinFET's metal gate and the n-type FinFET's metal gate. The neutral zone can thus be referred to as a metal diffusion barrier of the gate structure. The proposed neutral zone can significantly reduce n/p boundary effects, preventing undesired threshold voltage shifts of the p-type FinFET and/or the n-type FinFET. In an example, the p-type FinFET's metal gate and the n-type FinFET's metal gate of the proposed gate structure can each include a p-type metal layer and an n-type metal layer, where a configuration of the p-type metal layer and the n-type metal layer of the p-type FinFET's metal gate is different than a configuration of the p-type metal layer and the n-type metal layer of the n-type FinFET's metal gate. In some implementations, the configurations of the p-type metal layer and the n-type layer are used to achieve a work function of the p-type FinFET's metal gate that is different than a work function of the n-type FinFET's metal gate. In furtherance of the example, the neutral zone can include the p-type metal layer while being free of the n-type metal layer. In implementations where the n-type metal layer includes aluminum, the p-type metal layer of the neutral zone impedes or prevents aluminum from diffusing from the p-type FinFET's metal gate and the n-type FinFET's metal gate, and vice versa, thereby reducing n/p boundary effects.

FIG. 1 is a flow chart of a method 10 for fabricating an IC device having a gate structure configured with different work functions to enable transistors with different threshold voltages, such as a p-type transistor and an n-type transistor, according to various aspects of the present disclosure. At block 20, method 10 includes removing a dummy gate to form a gate trench in a gate structure, where the gate trench spans a first transistor region that corresponds with a first transistor, a second transistor region that corresponds with a second transistor, and a boundary region disposed between the first transistor region and the second transistor region. At block 30, method 10 includes forming a gate dielectric layer in the gate trench in the first transistor region, the second transistor region, and the boundary region. At block 40, method 10 includes forming a p-type work function layer in the gate trench over the gate dielectric layer in the first transistor region, the second transistor region, and the boundary region. The p-type work function layer has a first thickness in the first transistor region, a second thickness in the second transistor region, and a third thickness in the boundary region. The p-type work function layer and the gate dielectric layer fill the gate trench in the boundary region. In some implementations, forming the p-type work function layer includes depositing a p-type work function material over the gate dielectric layer that fills the gate trench, etching back the p-type work function material to the first thickness in the first transistor region while masking the p-type work function material in the second transistor region and the boundary region, and etching back the p-type work function material to the second thickness in the second transistor region while masking the p-type work function material in the first transistor region and the boundary region. In some implementations, forming the p-type work function layer includes depositing a first p-type work function material over the gate dielectric layer in the first transistor region, the second transistor region, and the third transistor region; removing the first p-type work function material from the first transistor region (while masking the first p-type work function material in the second transistor region and the boundary region); depositing a second p-type work function material over the gate dielectric layer in the first transistor region, the first p-type work function material in the second transistor region, and the first p-type work function material in the boundary region; removing the second p-type work function material from the first transistor region and the second transistor region (while masking the second p-type work function material in the boundary region); and depositing a third p-type work function material over the gate dielectric layer in the first transistor region, the first p-type work function material in the second transistor region, and the second p-type work function material in the boundary region. The first p-type work function material, the second p-type work function material, and the third p-type work function material may be the same or different depending on design requirements of the IC device. At block 50, method 10 includes forming an n-type work function layer in the gate trench over the p-type work function layer in the first transistor region and the second transistor region. In some implementations, method 10 can continue with forming a metal bulk layer in the gate trench over the n-type work function layer in the first transistor region. Additional steps can be provided before, during, and after method 10, and some of the steps described can be moved, replaced, or eliminated for additional embodiments of method 10.

FIGS. 2A-11A, FIGS. 2B-11B, FIGS. 2C-11C, and FIGS. 2D-11D are fragmentary diagrammatic views of an IC device 100, in portion or entirety, at various fabrication stages (such as those associated with method 10 in FIG. 1) according to various aspects of the present disclosure. In particular, FIGS. 2A-11A are top views of IC device 100 in an X-Y plane, FIGS. 2B-11B are diagrammatic cross-sectional views of IC device 100 in an X-Z plane along line B-B respectively of FIGS. 2A-11A, FIGS. 2C-11C are diagrammatic cross-sectional views of IC device 100 in an X-Z plane along line C-C respectively of FIGS. 2A-11A, and FIGS. 2D-11D are diagrammatic cross-sectional views of IC device 100 in an X-Z plane along line D-D respectively of FIGS. 2A-11A. IC device 100 may be included in a microprocessor, a memory, and/or other integrated circuit device. In some implementations, IC device 100 may be a portion of an IC chip, a system on chip (SoC), or portion thereof, that includes various passive and active microelectronic devices such as resistors, capacitors, inductors, diodes, p-type FETs (PFETs), n-type FETs (NFETs), metal-oxide-semiconductor FETs (MOSFETs), complementary MOS (CMOS) transistors, bipolar junction transistors (BJTs), laterally diffused MOS (LDMOS) transistors, high voltage transistors, high frequency transistors, other suitable components, or combinations thereof. The various transistors may be planar transistors or multi-gate transistors, such as FinFETs, depending on design requirements of IC device 100. FIGS. 2A-11A, FIGS. 2B-11B, FIGS. 2C-11C, and FIGS. 2D-11D have been simplified for the sake of clarity to better understand the inventive concepts of the present disclosure. Additional features can be added in IC device 100, and some of the features described below can be replaced, modified, or eliminated in other embodiments of IC device 100.

Turning to FIGS. 2A-2D, IC device 100 includes a substrate (wafer) 110. In the depicted embodiment, substrate 110 is a bulk substrate that includes silicon. Alternatively or additionally, the bulk substrate includes another elementary semiconductor, such as germanium; a compound semiconductor, such as silicon carbide, silicon phosphide, gallium arsenide, gallium phosphide, indium phosphide, indium arsenide, indium antimonide, zinc oxide, zinc selenide, zinc sulfide, zinc telluride, cadmium selenide, cadmium sulfide, and/or cadmium telluride; an alloy semiconductor, such as SiGe, SiPC, GaAsP, AlInAs, AlGaAs, GaInAs, GaInP, and/or GaInAsP; other group III-V materials; other group II-IV materials; or combinations thereof. Alternatively, substrate 110 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. Substrate 110 includes various doped regions, such as a doped region 112 and a doped region 114, configured according to design requirements of IC device 100. In some implementations, the doped regions are p-type doped regions (for example, p-type wells) doped with p-type dopants, such as boron (for example, $BF_2$), indium, other p-type dopant, or combinations thereof. In some implementations, the doped regions are n-type doped regions (for example, n-type wells) doped with n-type dopants, such as phosphorus, arsenic, other n-type dopant, or combinations thereof. In some implementations, the doped regions include a combination of p-type dopants and n-type dopants. In FIGS. 2A-2D, doped region 112 is configured for at least one p-type FinFET to be formed in a p-type FinFET region 116A and doped region 114 is configured for at least one n-type FinFET to be formed in an n-type FinFET region 116B of IC device 100. For example, doped region 112 is an n-type well and doped region 114 is a p-type well. The various doped regions can be formed directly on and/or in substrate 110, for example, providing a p-well structure, an n-well structure, a dual-well structure, a raised structure, or combinations thereof. An ion implantation process, a diffusion process, and/or other suitable doping process can be performed to form the various doped regions.

A fin 120A, a fin 120B, a fin 120C, and a fin 120D (also referred to as fin structures or active fin regions) are disposed over substrate 110. Fins 120A-120D are oriented substantially parallel to one another, each having a length defined in an x-direction, a width defined in a y-direction, and a height defined in a z-direction. Fins 120A-120D each have at least one channel region, at least one source region, and at least one drain region defined along their length in the x-direction, where a channel region is disposed between a source region and a drain region (generally referred to as source/drain regions). Channel regions include a top portion defined between sidewall portions, where the top portion and the sidewall portions engage with a gate structure (as described below), such that current can flow between the source/drain regions during operation. The source/drain regions also include top portions defined between sidewall portions. In some implementations, fins 120A-120D are a portion of substrate 110 (such as a portion of a material layer of substrate 110). For example, where substrate 110 includes silicon, fins 120A-120D include silicon. Alternatively, in some implementations, fins 120A-120D are defined in a material layer, such as one or more semiconductor material layers, overlying substrate 110. For example, fins 120A-120D can include a semiconductor layer stack having various semiconductor layers (such as a heterostructure) disposed over substrate 110. The semiconductor layers can include any suitable semiconductor materials, such as silicon, germanium, silicon germanium, other suitable semiconductor materials, or combinations thereof. The semiconductor layers can include same or different materials, etching rates, constituent atomic percentages, constituent weight percentages, thicknesses, and/or configurations depending on design requirements of IC device 100. In some implementations, the semiconductor layer stack includes alternating semiconductor layers, such as semiconductor layers composed of a first material and semiconductor layers composed of a second material. For example, the semiconductor layer stack alternates silicon layers and silicon germanium layers (for example, SiGe/Si/ . . . from bottom to top). In some implementations, the semiconductor layer stack includes semiconductor layers of the same material but with alternating constituent atomic percentages, such as semiconductor layers having a constituent of a first atomic percent and semiconductor layers having the constituent of a second atomic percent. For example, the semiconductor layer stack includes silicon germanium layers having alternating silicon and/or germanium atomic percentages (for example, $Si_aGe_b/Si_cGe_d/$ . . . from bottom to top, where a, c are different atomic percentages of silicon and b, d are different atomic percentages of germanium).

Fins 120A-120D are formed over substrate 110 by any suitable process. In some implementations, a combination of deposition, lithography and/or etching processes are performed to define fins 120A-120D extending from substrate 110. For example, forming fins 120A-120D includes performing a lithography process to form a patterned mask layer over substrate 110 (or a material layer, such as a heterostructure, disposed over substrate 110) and performing an etching process to transfer a pattern defined in the patterned mask layer to substrate 110 (or the material layer, such as the heterostructure, disposed over substrate 110). The lithography process can include forming a resist layer on a mask layer disposed over substrate 110 (for example, by spin coating), performing a pre-exposure baking process, performing an exposure process using a mask, performing a post-exposure baking process, and performing a developing process. During the exposure process, the resist layer is exposed to radiation energy (such as ultraviolet (UV) light, deep UV (DUV) light, or extreme UV (EUV) light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the mask. The etching process uses the patterned resist layer as an etch mask to remove portions of the mask layer, and then uses the patterned mask layer to remove portions of substrate 110 (or a material layer disposed over substrate 110). The etching process can include a dry etching process (for example, a reactive ion etching (RIE) process), a wet etching process, other suitable etching process, or combinations thereof. The patterned resist layer is removed during or after, for example, by a resist stripping process, the etching process. Alternatively or additionally, fins 120A-120D are formed by a multiple patterning process, such as a double patterning lithography (DPL) process (for example, a lithography-etch-lithography-etch (LELE) process, a self-aligned double patterning (SADP) process, a spacer-is-dielectric patterning (SIDP) process, other double patterning process, or combinations thereof), a triple patterning process (for example, a lithography-etch-lithography-etch-lithography-etch (LELELE) process, a self-aligned triple patterning (SATP) process, other triple patterning process, or combinations thereof), other multiple patterning process (for example, self-aligned quadruple patterning (SAQP) process), or combinations thereof. Generally, double patterning processes and/or multiple patterning processes combine lithography processes and self-aligned processes, allowing patterns to be created that have, for example, pitches smaller than what is otherwise obtainable using a single, direct lithography process. For example, in some implementations, a mandrel layer is used as an etch mask for removing portions of the mask layer, where the mandrel layer is formed using a spacer patterning technique. For example, forming the mandrel layer includes forming a patterned sacrificial layer (which includes sacrificial features having a first spacing) over the mask layer using a lithography process (for example, using the patterned resist layer), forming a spacer layer over the patterned sacrificial layer, etching the spacer layer to form spacers along sidewalls of each sacrificial feature (for example, the spacer layer is removed from a top surface of the sacrificial features and a portion of a top surface of mask layer), and removing the patterned sacrificial layer, leaving spacers having a second spacing (which can be referred to as a patterned spacer layer, which includes openings that expose a portion of the mask layer). Mandrel layer and its mandrels can thus respectively be referred to as a spacer layer and spacers. In some implementations, the spacer layer is conformally formed over the patterned sacrificial layer, such that the spacer layer has a substantially uniform thickness. In some implementations, the spacers are trimmed before or after removing the patterned sacrificial layer. In some implementations, directed self-assembly (DSA) techniques are implemented while forming fins 120A-120D.

An isolation feature(s) 122 is formed over and/or in substrate 110 to isolate various regions, such as various device regions, of IC device 100. For example, isolation feature 122 separates and isolates active device regions and/or passive device regions from each other, such as the various FinFETs of IC device 100. Isolation feature 122 further separates and isolates fins 120A-120D from one another. In the depicted embodiment, isolation feature 122 surrounds a bottom portion of fins 120A-120D. Isolation feature 122 includes silicon oxide, silicon nitride, silicon oxynitride, other suitable isolation material (for example, including silicon, oxygen, nitrogen, carbon, and/or other suitable isolation constituent), or combinations thereof. Isolation feature 122 can include different structures, such as shallow trench isolation (STI) structures, deep trench isolation (DTI) structures, and/or local oxidation of silicon (LOCOS) structures. In some implementations, STI features can be formed by etching a trench in substrate 110 (for example, by using a dry etch process and/or wet etch process) and filling the trench with insulator material (for example, by using a chemical vapor deposition process or a spin-on glass process). A chemical mechanical polishing (CMP) process may be performed to remove excessive insulator material and/or planarize a top surface of isolation feature 122. In some implementations, STI features can be formed by depositing an insulator material over substrate 110 after forming fins 120A-120D (in some implementations, such that the insulator material layer fills gaps (trenches) between fins 120A-120D) and etching back the insulator material layer to form isolation feature 122. In some implementations, isolation feature 122 includes a multi-layer structure that fills trenches, such as a bulk dielectric layer disposed over a liner dielectric layer, where the bulk dielectric layer and the liner dielectric layer include materials depending on design requirements (for example, a bulk dielectric layer that includes silicon nitride disposed over a liner dielectric layer that includes thermal oxide). In some implementations, isolation feature 122 includes a dielectric layer disposed over a doped liner layer (including, for example, boron silicate glass (BSG) or phosphosilicate glass (PSG)).

A gate structure 130 is disposed over fins 120A-120D and isolation feature 122. Gate structure 130 extends along the y-direction (for example, substantially perpendicular to fins 120A-120D) and traverses respective fin structures 120A-120D, such that gate structure 130 wraps upper portions of respective fins 120A-120D. Gate structure 130 is disposed over and wraps channel regions of fins 120A-120D, thereby interposing respective source/drain regions of fins 120A-120D. Gate structure 130 engages the respective channel regions of fins 120A-120D, such that current can flow between the respective source/drain regions of fins 120A-120D during operation. As described further below, gate structure 130 includes a gate region 130-1 that corresponds with a portion of gate structure 130 that will be configured for a p-type FinFET, a gate region 130-2 that corresponds with a portion of gate structure 130 that will be configured as a neutral (or boundary) region between the p-type FinFET gate portion and an n-type FinFET gate portion, and a gate region 130-3 that corresponds with a portion of gate structure 130 that will be configured for the n-type FinFET. Gate region 130-2 spans an interface (or boundary) between p-type FinFET region 116A and n-type FinFET region 116B, such as an interface (or boundary) between doped well 112 and doped well 114. In the depicted embodiment, where doped well 112 and doped well 114 are respectively an n-well and a p-well, the interface can be referred to as an n/p boundary. Gate region 130-2 is defined with respect to the n/p boundary and is configured to overlap the n/p boundary, along with a portion of p-type FinFET region 116A and a portion of n-type FinFET region 116A, such that the p-type FinFET gate portion (corresponding with gate region 130-1) and the n-type FinFET gate portion (corresponding with gate region 130-2) are each spaced a distance from the n/p boundary.

Gate structure 130 includes a gate stack configured for a gate last process, such as a dummy gate 132 that is subsequently replaced with a metal gate. Dummy gate 132 can include a multi-layer structure. In some implementations, dummy gate 132 includes an interfacial layer (including, for example, silicon and oxygen, such as silicon oxide) and a dummy gate layer. In some implementations, gate structure 130 includes a polysilicon gate, such that the dummy gate layer includes a polysilicon layer. In some implementations, the dummy gate layer includes a dummy gate dielectric (including, for example, a dielectric material) and a dummy gate electrode (including, for example, polysilicon), where the dummy gate dielectric is disposed between the interfacial layer and the dummy gate dielectric. Dummy gate 132 is formed by deposition processes, lithography processes, etching processes, other suitable processes, or combinations thereof. For example, a thermal oxidation process may be performed to form the interfacial layer over substrate 110, particularly over fins 120A-120D. One or more deposition processes are then performed to form a dummy gate layer over the interfacial layer. In some implementations, a deposition process is performed to form a dummy gate dielectric layer over the interfacial layer, and a deposition process is performed to form a dummy gate electrode layer over the dummy gate dielectric layer. The deposition processes include CVD, physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable methods, or combinations thereof. A lithography patterning and etching process is then performed to pattern the interfacial layer and the dummy gate layer (in some implementations, a dummy gate dielectric layer and a dummy gate electrode layer) to form a dummy gate stack, such that the dummy gate stack (including the interfacial layer and the dummy gate layer) wrap channel regions of fins 120A-120D. The lithography patterning processes include resist coating (for example, spin-on coating), soft baking, mask aligning, exposure, post-exposure baking, developing the resist, rinsing, drying (for example, hard baking), other suitable processes, or combinations thereof. Alternatively, the lithography exposing process is assisted, implemented, or replaced by other methods, such as maskless lithography, electron-beam writing, or ion-beam writing. The etching processes include dry etching processes, wet etching processes, other etching methods, or combinations thereof. Dummy gate 132 can include numerous other layers, for example, capping layers, interface layers, diffusion layers, barrier layers, hard mask layers, or combinations thereof.

Gate structure 130 further includes gate spacers 136 disposed adjacent to (for example, along sidewalls of) dummy gate 132. Gate spacers 136 are formed by any suitable process and include a dielectric material. The dielectric material can include silicon, oxygen, carbon, nitrogen, other suitable material, or combinations thereof (for example, silicon oxide, silicon nitride, silicon oxynitride, or silicon carbide). For example, in the depicted embodiment, a dielectric layer including silicon and nitrogen, such as a silicon nitride layer, can be deposited over substrate 110 and dummy gate 132 and subsequently anisotropically etched to form gate spacers 136. In some implementations, gate spacers 136 include a multi-layer structure, such as a first dielectric layer that includes silicon nitride and a second dielectric layer that includes silicon oxide. In some implementations, gate spacers 136 include more than one set of spacers, such as seal spacers, offset spacers, sacrificial spacers, dummy spacers, and/or main spacers, formed adjacent to the gate stacks. In such implementations, the various sets of spacers can include materials having different etch rates. For example, a first dielectric layer including silicon and oxygen can be deposited over substrate 110 and dummy gate 132 and subsequently anisotropically etched to form a first spacer set adjacent to the gate stacks, and a second dielectric layer including silicon and nitrogen can be deposited over substrate 110 and dummy gate 132 and subsequently anisotropically etched to form a second spacer set adjacent to the first spacer set. Implantation, diffusion, and/or annealing processes may be performed to form lightly doped source and drain (LDD) features and/or heavily doped source and drain (HDD) features (both of which are not shown in FIGS. 2A-2D) in source/drain (S/D) regions of fins 120A-120D before and/or after forming gate spacers 136.

Source features and drain features (referred to as source/drain features) are formed in source/drain regions of fins 120A-120D. For example, semiconductor material is epitaxially grown on fins 120A-120D, forming epitaxial source/drain features 140A on fins 120A, 120B in p-type FinFET region 116A and epitaxial source/drain features 140B on fins 120C, 120D in n-type FinFET region 106B. In some implementations, a fin recess process (for example, an etch back process) is performed on source/drain regions of fins 120A-120D, such that epitaxial source/drain features 140A and epitaxial source/drain features 140B are grown from bottom portions of fins 120A-120D. In some implementations, source/drain regions of fins 120A-120D are not subjected to a fin recess process, such that epitaxial source/drain features 140A, 140B are grown from and wrap at least a portion of upper fin active regions of fins 120A-120D. Epitaxial source/drain features 140A, 140B can extend (grow) laterally along the y-direction (in some implementations, substantially perpendicular to fins 120A-120D), such that epitaxial source/drain features 140A, 140B are merged epitaxial source/drain features that span more than one fin (for example, epitaxial source/drain features 140A span fins 120A, 120B and epitaxial source/drain features 140B span fins 120C, 120D). In some implementations, epitaxial source/drain features 140A and/or epitaxial source/drain features 140B include partially merged portions (with interruption (or gaps) between epitaxial material grown from adjacent fins 120A-120D) and/or fully merged portions (without interruption (or gaps) between epitaxial material grown from adjacent fins 120A-120D).

An epitaxy process can implement CVD deposition techniques (for example, vapor-phase epitaxy (VPE), ultra-high vacuum CVD (UHV-CVD), LPCVD, and/or PECVD), molecular beam epitaxy, other suitable SEG processes, or combinations thereof. The epitaxy process can use gaseous and/or liquid precursors, which interact with the composition of fins 120A-120D. Epitaxial source/drain features 140A, 140B are doped with n-type dopants and/or p-type dopants. In the depicted embodiment, epitaxial source/drain features 140A, 140B are configured depending on a type of FinFET fabricated in their respective FinFET device region. For example, in p-type FinFET region 116A, epitaxial source/drain features 140A can include epitaxial layers including silicon and/or germanium, where the silicon germanium containing epitaxial layers are doped with boron, carbon, other p-type dopant, or combinations thereof (for example, forming an Si:Ge:B epitaxial layer or an Si:Ge:C epitaxial layer). In furtherance of the example, in n-type FinFET region 116B, epitaxial source/drain features 140B can include epitaxial layers including silicon and/or carbon, where silicon-containing epitaxial layers or silicon-carbon-containing epitaxial layers are doped with phosphorous, arsenic, other n-type dopant, or combinations thereof (for example, forming an Si:P epitaxial layer, an Si:C epitaxial layer, an Si:As epitaxial layer, or an Si:C:P epitaxial layer). In some implementations, epitaxial source/drain features 140A, 140B include materials and/or dopants that achieve desired tensile stress and/or compressive stress in the channel regions. In some implementations, epitaxial source/drain features 140A, 140B are doped during deposition by adding impurities to a source material of the epitaxy process. In some implementations, epitaxial source/drain features 140A, 140B are doped by an ion implantation process subsequent to a deposition process. In some implementations, annealing processes are performed to activate dopants in epitaxial source/drain features 140A, epitaxial source/drain features 140B, and/or other source/drain features of IC device 100, such as HDD regions and/or LDD regions.

An interlevel dielectric (ILD) layer 150 is formed over substrate 110, particularly over epitaxial source/drain features 140A, 140B, gate structure 130, and fins 120A-120D. In some implementations, ILD layer 150 is a portion of a multilayer interconnect (MLI) feature that electrically couples various devices (for example, transistors, resistors, capacitors, and/or inductors) and/or components (for example, gate structures and/or source/drain features) of IC device 100, such that the various devices and/or components can operate as specified by design requirements of IC device 100. ILD layer 150 includes a dielectric material including, for example, silicon oxide, silicon nitride, silicon oxynitride, TEOS formed oxide, PSG, BPSG, low-k dielectric material, other suitable dielectric material, or combinations thereof. Exemplary low-k dielectric materials include FSG, carbon doped silicon oxide, Black Diamond® (Applied Materials of Santa Clara, Calif.), Xerogel, Aerogel, amorphous fluorinated carbon, Parylene, BCB, SILK (Dow Chemical, Midland, Mich.), polyimide, other low-k dielectric material, or combinations thereof. In some implementations, ILD layer 150 has a multilayer structure having multiple dielectric materials. In some implementations, a contact etch stop layer (CESL) is disposed between ILD layer 150 and epitaxial source/drain features 140A, 140B, fins 120A-120D, and/or gate structure 130. The CESL includes a material different than ILD layer 150, such as a dielectric material that is different than the dielectric material of ILD layer 150. In the depicted embodiment, where ILD layer 150 includes a low-k dielectric material, the CESL includes silicon and nitrogen (for example, silicon nitride or silicon oxynitride). ILD layer 150 and/or the CESL are formed over substrate 110, for example, by a deposition process (such as CVD, PVD, ALD, HDPCVD, MOCVD, RPCVD, PECVD, LPCVD, ALCVD, APCVD, plating, other suitable methods, or combinations thereof). In some implementations, ILD layer 150 is formed by a flowable CVD (FCVD) process that includes, for example, depositing a flowable material (such as a liquid compound) over substrate 110 and converting the flowable material to a solid material by a suitable technique, such as thermal annealing and/or ultraviolet radiation treating. Subsequent to the deposition of ILD layer 150 and/or the CESL, a CMP process and/or other planarization process is performed until reaching (exposing) a top surface of dummy gate 132 of gate structure 130.

Turning to FIGS. 3A-3D, a gate replacement process begins for replacing a dummy gate stack (here, dummy gate 132) of gate structure 130 with a metal gate stack. For example, dummy gate 132 is removed to form a gate trench (opening) 160 in gate structure 130. Gate trench 160 exposes upper portions of fins 120A-120D (also referred to as upper fin active regions of fins 120A-120D). For example, removing dummy gate 132 exposes channel regions of fins 120A-120D. In some implementations, a portion of dummy gate 132 is removed, such that gate trenches 160 expose the interfacial layer and/or the dummy gate dielectric of dummy gate 132. In such implementations, the interfacial layer and/or the dummy gate dielectric become a portion of the metal gate stack of gate structure 130. The etching process is a dry etching process, a wet etching process, or combinations thereof. In some implementations, an etching process selectively removes dummy gate 132 without (or minimally) removing ILD layer 150, gate spacers 136, isolation feature 122, fins 120A-120D, and/or other features of IC device 100. In some implementations, a selective etching process can be tuned, such that a dummy gate electrode layer (including, for example, polysilicon) has an adequate etch rate relative to the interfacial layer and/or the dummy gate dielectric of dummy gate 132, gate spacers 136, ILD layer 150, and/or other feature of IC device 100.

Turning to FIGS. 4A-4D, a gate dielectric layer 170 is formed over IC device 100. For example, an ALD process conformally deposits gate dielectric layer 170 over IC device 100, such that gate dielectric layer 170 has a substantially uniform thickness and partially fills gate trench 160 in gate region 130-1, gate region 130-2, and gate region 130-3. Gate dielectric layer 170 is disposed on sidewall surfaces and bottom surfaces defining gate trench 160, such that gate dielectric layer 170 is disposed on fins 120A-120D, isolation feature 122, and gate spacers 136. In some implementations, gate dielectric layer 170 has a thickness of about 1 nm to about 2.5 nm. In the depicted embodiment, gate dielectric layer 170 includes a high-k dielectric material (and thus may be referred to as a high-k dielectric layer), such as hafnium dioxide ($HfO_2$), HfSiO, HfSiON, HMO, HfTiO, HfZrO, zirconium oxide, aluminum oxide, hafnium dioxide-alumina ($HfO_2$—$Al_2O_3$) alloy, other suitable high-k dielectric material, or combinations thereof. High-k dielectric material generally refers to dielectric materials having a high dielectric constant, for example, greater than that of silicon oxide (k≈3.9). In some implementations, gate dielectric layer 170 includes a dielectric material, such as silicon oxide or other suitable dielectric material. Alternatively, gate dielectric layer 170 is formed using another suitable deposition process, such as CVD, PVD, HDPCVD, MOCVD, RPCVD, PECVD, LPCVD, ALCVD, APCVD, spin coating, plating, other deposition process, or combinations thereof. In some implementations, an interfacial layer (not shown) is formed over IC device 100 before forming gate dielectric layer 170, such that the interfacial layer is disposed between gate dielectric layer 170 and fins 120A-120C. The interfacial layer includes a dielectric material, such as silicon oxide, and is formed by any of the processes described herein, such as by thermal oxidation. In some implementations, the interfacial layer has a thickness of about 0.7 nm to about 1.5 nm. In some implementations, the interfacial layer is a portion of dummy gate 132 that is not removed when forming gate trench 160. In some implementations, the interfacial layer is also disposed between gate dielectric layer 170 and isolation feature 122, gate spacers 136, and/or ILD layer 150 depending on design requirements of IC device 100.

Turning to FIGS. 5A-5D, a first p-type work function layer 180 is formed over gate dielectric layer 170. For example, an ALD process conformally deposits first p-type work function layer 180 on gate dielectric layer 170, such that first p-type work function layer 180 has a substantially uniform thickness and partially fills gate trench 160 in gate region 130-1, gate region 130-2, and gate region 130-3. In some implementations, first p-type work function layer 180 has a thickness of about 0.8 nm to about 3 nm. First p-type work function layer 180 includes any suitable p-type work function material, such as TiN, TaN, Ru, Mo, Al, WN, $ZrSi_2$, $MoSi_2$, $TaSi_2$, $NiSi_2$, WN, other p-type work function material, or combinations thereof. In the depicted embodiment, first p-type work function layer 180 includes titanium and nitrogen, such as TiN. First p-type work function layer 180 can be formed using another suitable deposition process, such as CVD, PVD, HDPCVD, MOCVD, RPCVD, PECVD, LPCVD, ALCVD, APCVD, spin coating, plating, other deposition process, or combinations thereof.

Turning to FIGS. 6A-6D, first p-type work function layer 180 is removed from gate region 130-1, which corresponds with a portion of gate structure 130 to be configured for the p-type FinFET. For example, a patterned masking layer 185 having one or more openings 187 is formed over IC device 100. Patterned masking layer 185 covers n-type FinFET region 116A and a neutral region 190, which spans the interface between p-type FinFET region 116A and n-type FinFET region 116B, a portion of p-type FinFET region 116A adjacent to the interface, and a portion of n-type FinFET region 116B adjacent to the interface. Patterned masking layer 185 thus covers gate region 130-2 and gate region 130-3, which correspond with portions of gate structure 130 to be configured respectively for the neutral region and the n-type FinFET. Since a portion of p-type FinFET region 116A is defined as a portion of neutral region 190, opening 187 partially exposes p-type FinFET region 116A and fully exposes gate region 130-1, particularly exposing first p-type work function layer 180 in these regions. Patterned masking layer 185 includes a material that is different than a material of first p-type work function layer 180 and a material of gate dielectric layer 170 to achieve etching selectivity during removal of first p-type work function layer 180. For example, patterned masking layer 185 includes a dielectric material that includes silicon and nitrogen (for example, SiN). In some implementations, patterned masking layer 185 includes silicon, amorphous silicon, semiconductor oxide (for example, silicon oxide ($SiO_2$)), semiconductor nitride (for example, silicon nitride (SiN)), semiconductor oxynitride (for example, silicon oxynitride (SiON)), and/or semiconductor carbide (for example, silicon carbide (SiC)), other semiconductor material, and/or other dielectric material. In some implementations, patterned masking layer 185 includes a resist material (and thus may be referred to as a patterned resist layer and/or a patterned photoresist layer). In some implementations, patterned masking layer 185 has a multi-layer structure, such as a mask barrier layer and a mask layer disposed over the mask barrier layer.

Patterned masking layer 185 is formed by deposition processes, lithography processes, and/or etching processes. For example, a mask layer is deposited over IC device 100 by CVD, PVD, ALD, HDPCVD, MOCVD, RPCVD, PECVD, LPCVD, ALCVD, APCVD, plating, other suitable deposition process, or combinations thereof. Opening 187 is then formed by performing a lithography process to form a patterned resist layer over the mask layer and performing an etching process to transfer a pattern defined in the patterned resist layer to the mask layer. The lithography process can include forming a resist layer on the mask layer (for example, by spin coating), performing a pre-exposure baking process, performing an exposure process using a mask, performing a post-exposure baking process, and performing a developing process. During the exposure process, the resist layer is exposed to radiation energy (such as UV light, DUV light, or EUV light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the mask. The etching process uses the patterned resist layer as an etch mask to remove portions of the mask layer, thereby forming patterned masking layer 185 having opening 187. The etching process can include a dry etching process, a wet etching process, other suitable etching process, or combinations thereof. After the etching process, the patterned resist layer is removed from patterned masking layer 185, for example, by a resist stripping process. Alternatively, the exposure process can be implemented or replaced by other methods, such as maskless lithography, e-beam writing, ion-beam writing, and/or nanoimprint technology.

Any suitable process is then used to completely remove first p-type work function layer 180 from the exposed portion of p-type FinFET region 116A (including gate region 130-1), thereby exposing gate dielectric layer 170 in gate region 130-1. For example, an etching process selectively removes first p-type work function layer 180 without substantially etching gate dielectric layer 170 and/or patterned masking layer 185. In some implementations, a wet etching process removes first p-type work function layer 180 using an etching solution that includes ammonium hydroxide ($NH_4OH$), hydrogen peroxide ($H_2O_2$), sulfuric acid ($H_2SO_4$), tetramethylammonium hydroxide (TMAH), hydrogen chloride (HCl), other suitable wet etching solution, or combinations thereof. For example, the wet etching solution utilizes an $NH_4OH:H_2O_2$ solution, an $HCl:H_2O_2:H_2O$ solution (known as an hydrochloric-peroxide mixture (HPM)), an $NH_4OH:H_2O_2:H_2O$ solution (known as an ammonia-peroxide mixture (APM)), or an $H_2SO_4:H_2O_2$ solution (known as a sulfuric peroxide mixture (SPM)). In some implementations, a dry etching process or combination of a dry etching process and a wet etching process is implemented for removing first p-type work function layer 180. Thereafter, patterned masking layer 185 is removed from over IC device 100, for example, by an etching process that selectively removes patterned masking layer 185 without substantially etching gate dielectric layer 170 and first p-type work function layer 180 or a resist stripping process. The present disclosure further contemplates embodiments where a thickness of first p-type work function layer 180 is reduced, instead of completely removed from the exposed portion of p-type FinFET region 116A (including gate region 130-1).

Turning to FIGS. 7A-7D, a second p-type work function layer 200 is formed over gate dielectric layer 170 in gate region 130-1 and over first p-type work function layer 180 in gate region 130-2 and gate region 130-3. For example, an ALD process conformally deposits second p-type work function layer 200 on gate dielectric layer 170 in gate region 130-1 and over first p-type work function layer 180 in gate region 130-2 and gate region 130-3, such that second p-type work function layer 200 has a substantially uniform thickness and partially fills gate trench 160 in gate region 130-1, gate region 130-2, and gate region 130-3. In some implementations, second p-type work function layer 200 has a thickness of about 0.8 nm to about 3 nm. Second p-type work function layer 200 includes any suitable p-type work function material, such as TiN, TaN, Ru, Mo, Al, WN, $ZrSi_2$, $MoSi_2$, $TaSi_2$, $NiSi_2$, WN, other p-type work function material, or combinations thereof. In the depicted embodiment, second p-type work function layer 200 and first p-type work function layer 180 include the same material. For example, second p-type work function layer 200 includes titanium and nitrogen, such as TiN. Second p-type work function layer 200 can be formed using another suitable deposition process, such as CVD, PVD, HDPCVD, MOCVD, RPCVD, PECVD, LPCVD, ALCVD, APCVD, spin coating, plating, other deposition process, or combinations thereof.

Turning to FIGS. 8A-8D, second p-type work function layer 200 is removed from gate region 130-1 and gate region 130-3, which correspond with portions of gate structure 130 to be configured for the p-type FinFET and the n-type FinFET, respectively. For example, a patterned masking layer 205 having one or more openings 207 is formed over IC device 100. Patterned masking layer 205 covers neutral region 190, thus covering gate region 130-2, which corresponds with the portion of gate structure 130 to be configured for the neutral region. Since a portion of p-type FinFET region 116A and a portion of n-type FinFET region 116B is defined as neutral region 190, openings 207 partially expose p-type FinFET region 116A and n-type FinFET region 116B, yet fully expose gate region 130-1 and gate region 130-3, particularly exposing second p-type work function layer 200 in these regions. Patterned masking layer 205 is formed by any suitable process, such as the processes described above to form patterned masking layer 185. Patterned masking layer 205 includes a material that is different than a material of second p-type work function layer 200, a material of first p-type work function layer 180, and a material of gate dielectric layer 170 to achieve etching selectivity during removal of second p-type work function layer 200. For example, patterned masking layer 205 includes a dielectric material that includes silicon and nitrogen (for example, SiN). In some implementations, patterned masking layer 205 includes silicon, amorphous silicon, semiconductor oxide (for example, silicon oxide ($SiO_2$)), semiconductor nitride (for example, silicon nitride (SiN)), semiconductor oxynitride (for example, silicon oxynitride (SiON)), and/or semiconductor carbide (for example, silicon carbide (SiC)), other semiconductor material, and/or other dielectric material. In some implementations, patterned masking layer 205 includes a resist material (and thus may be referred to as a patterned resist layer and/or a patterned photoresist layer). In some implementations, patterned masking layer 205 has a multi-layer structure, such as a mask barrier layer and a mask layer disposed over the mask barrier layer.

Any suitable process is then used to completely remove second p-type work function layer 200 from the exposed portion of p-type FinFET region 116A (including gate region 130-1) and the exposed portion of n-type FinFET region 116B (including gate region 130-3), thereby exposing gate dielectric layer 170 in gate region 130-1 and first p-type work function 180 in gate region 130-3. For example, an etching process selectively removes second p-type work function layer 200 without substantially etching gate dielectric layer 170 and/or patterned masking layer 205. In some implementations, a wet etching process removes second p-type work function layer 200 using an etching solution that includes ammonium hydroxide ($NH_4OH$), hydrogen peroxide ($H_2O_2$), sulfuric acid ($H_2SO_4$), tetramethylammonium hydroxide (TMAH), hydrogen chloride (HCl), other suitable wet etching solution, or combinations thereof. For example, the wet etching solution utilizes an $NH_4OH:H_2O_2$ solution, an $HCl:H_2O_2:H_2O$ solution (known as an hydrochloric-peroxide mixture (HPM)), an $NH_4OH:H_2O_2:H_2O$ solution (known as an ammonia-peroxide mixture (APM)), or an $H_2SO_4:H_2O_2$ solution (known as a sulfuric peroxide mixture (SPM)). In some implementations, a dry etching process or combination of a dry etching process and a wet etching process is implemented for removing second p-type work function layer 200. Thereafter, patterned masking layer 205 is removed from over IC device 100, for example, by an etching process that selectively removes patterned masking layer 205 without substantially etching gate dielectric layer 170, first p-type work function layer 180, and second p-type work function layer 200, or a resist stripping process. The present disclosure further contemplates embodiments where a thickness of second p-type work function layer 200 is reduced, instead of completely removed from the exposed portion of p-type FinFET region 116A (including gate region 130-1) and/or the exposed portion of n-type FinFET region 116B (including gate region 130-3). In some implementations, second p-type work function layer 200 is etched back in the exposed portion of n-type FinFET region 116B, such that a thickness of second p-type work function layer 200 in gate region 130-3 is less than a thickness of second p-type work function layer 200 in gate region 130-2. In some implementations, second p-type work function layer 200 is etched back in the exposed portion of p-type FinFET region 116A, such that a thickness of second p-type work function layer 200 in gate region 130-1 is less than a thickness of second p-type work function layer 200 in gate region 130-2.

Turning to FIGS. 9A-9D, a third p-type work function layer 210 is formed over gate dielectric layer 170 in gate region 130-1, second p-type work function layer 200 in gate region 130-2, and first p-type work function layer 180 in gate region 130-3. For example, an ALD process conformally deposits third p-type work function layer 210 on gate dielectric layer 170 in gate region 130-1, second p-type work function layer 200 in gate region 130-2, and first p-type work function layer 180 in gate region 130-3, such that third p-type work function layer 210 has a substantially uniform thickness. Because first p-type work function layer 180 and second p-type work function layer 200 are not removed from gate region 130-2, a width of gate trench 160 in gate region 130-2 is less than a width of gate trench 160 in gate region 130-1 and a width of gate trench 160 in gate region 130-3. The width differences in gate trench 160 in gate regions 130-1, 130-2, and 130-3 results in third p-type work function layer 210 filling remaining gate trench 160 in gate region 130-2 and partially filling remaining gate trench 160 in gate region 130-1 and gate region 130-3. Further, the width of gate trench 160 in gate region 130-3 is less than the width of gate trench 160 in gate region 130-1 because first p-type work function layer 180 was not removed from gate region 130-3. In some implementations, third p-type work function layer 210 has a thickness of about 0.8 nm to about 3 nm. Third p-type work function layer 210 includes any suitable p-type work function material, such as TiN, TaN, Ru, Mo, Al, WN, $ZrSi_2$, $MoSi_2$, $TaSi_2$, $NiSi_2$, WN, other p-type work function material, or combinations thereof. In the depicted embodiment, third p-type work function layer 210, second p-type work function layer 200, and first p-type work function layer 180 include the same material. For example, third p-type work function layer 210 includes titanium and nitrogen, such as TiN. Third p-type work function layer 210 can be formed using another suitable deposition process, such as CVD, PVD, HDPCVD, MOCVD, RPCVD, PECVD, LPCVD, ALCVD, APCVD, spin coating, plating, other deposition process, or combinations thereof.

Turning to FIGS. 10A-10D, an n-type work function layer 220 is formed over third p-type work function layer 210 in gate region 130-1, gate region 130-2, and gate region 130-3. For example, an ALD process deposits n-type work function layer 220 on third p-type work function layer 210 in gate region 130-1, gate region 130-2, and gate region 130-3. N-type work function layer 220 fills remaining gate trench 160 in gate region 130-1 and gate region 130-3. Since the width of gate trench 160 in gate region 130-1 is greater than the width of gate trench 160 in gate region 130-3, a thickness of n-type work function layer 220 in gate region 130-1 is greater than a thickness of n-type work function layer 220 in gate region 130-2. Since gate trench 160 in gate region 130-2 is filled with gate dielectric layer 170, first p-type work function layer 180, second p-type work function layer 200, and third p-type work function layer 210, n-type work function layer 220 does not fill gate trench 160 in gate region 130-2. In some implementations, n-type work function layer 220 has a thickness of about 1.5 nm to about 2.5 nm. N-type work function layer 220 includes any suitable n-type work function material, such as Ti, Al, Ag, Mn, Zr, TiAl, TiAlC, TaC, TaCN, TaSiN, TaAl, TaAlC, TiAlN, other n-type work function material, or combinations thereof. In the depicted embodiment, n-type work function layer 220 includes aluminum. For example, n-type work function layer 220 includes titanium and aluminum, such as TaAlC, TaAl, TiAlC, TiAl, TaSiAl, TiSiAl, TaAlN, or TiAlN. Alternatively, n-type work function layer 220 is formed using another suitable deposition process, such as CVD, PVD, HDPCVD, MOCVD, RPCVD, PECVD, LPCVD, ALCVD, APCVD, spin coating, plating, other deposition process, or combinations thereof.

Turning to FIGS. 11A-11D, a planarization process is performed to remove excess gate materials from IC device 100. For example, a CMP process is performed until a top surface of ILD layer 150 is reached (exposed), such that a top surface of gate structure 130 is substantially planar with a top surface of ILD layer 150 after the CMP process. In the depicted embodiment, gate structure 130 is thus configured with three different metal gate portions—a metal gate 230A in gate region 130-1, a metal gate 230B in gate region 130-2, and a metal gate 230C in gate region 130-3. Metal gate 230A includes a gate dielectric layer 170A, a p-type work function layer 240A (comprising third p-type work function layer 210), and an n-type work function layer 220A. Metal gate 230B includes a gate dielectric layer 170B, a p-type work function layer 240B (comprising first p-type work function layer 180, second p-type work function layer 200, and third p-type work function layer 210, all of which include the same material in the depicted embodiment). Metal gate 230C includes a gate dielectric layer 170C, a p-type work function layer 240C (comprising first p-type work function layer 180 and third p-type work function layer 210, both of which include the same material in the depicted embodiment), and an n-type work function layer 220C. Accordingly, IC device 100 includes a p-type FinFET in p-type FinFET region 116A that includes metal gate 230A wrapping portions of fins 120A, 120B, such that metal gate 230A is disposed between epitaxial source/drain features 140A, and an n-type FinFET in n-type FinFET region 116B that includes metal gate 230C wrapping fins 120C, 120D, such that metal gate 230C is disposed between epitaxial source/drain features 140B. Different threshold voltages are achieved for the p-type FinFET and the n-type FinFET because the p-type work function layers and the n-type work function layers of metal gates 230A, 230C have different thicknesses, such that metal gates 230A, 230C have different effective work functions. For example, a thickness of p-type work function layer 240A is less than a thickness of p-type work function layer 240C, and a thickness of n-type work function layer 220A is greater than a thickness of n-type work function layer 220C. Thicknesses of p-type work function layer 240A, n-type work function layer 220A, p-type work function layer 240C, and/or n-type work function layer 220C vary depending on desired threshold voltages of the p-type FinFET and the n-type FinFET and/or design requirements of IC device 100. In some implementations, a ratio of the thickness of p-type work function layer 240A to the thickness of n-type work function layer 220A is about 1:1 to about 1:30. In some implementations, a ratio of the thickness of p-type work function layer 240C to the thickness of n-type work function layer 220C is about 1:1 to about 1:30. In some implementations, p-type work function layer 240A is eliminated from metal gate 230A, such that metal gate 230A includes only gate dielectric layer 170A and n-type work function layer 220A. In some implementations, p-type work function layer 240C is eliminated from metal gate 230C, such that metal gate 230C includes only gate dielectric layer 170C and n-type work function layer 220C.

For a conventional IC device having a p-type FinFET disposed adjacent to an n-type FinFET, a gate structure spanning the p-type FinFET and the n-type FinFET includes a first metal gate configured for the p-type FinFET (referred to hereafter as the p-type FinFET's metal gate) and a second metal gate configured for the n-type FinFET (referred to hereafter as the n-type FinFET's metal gate), where the p-type FinFET's metal gate and the n-type FinFET's metal gate share an interface or boundary (referred to hereafter as an n/p (or p/n) boundary). For example, referring to IC device 100, metal gate 230A configured for the p-type FinFET would be disposed directly adjacent to and share an interface (boundary) with metal gate 230C configured for the n-type FinFET. Though the p-type FinFET and the n-type FinFET are configured to operate independently, metal diffusion across the n/p boundary (particularly from n-type work function layers) has been observed to undesirably shift threshold voltages of the p-type FinFET and/or the n-type FinFET. For example, aluminum from the n-type FinFET's metal gate diffusing laterally and vertically across the n/p boundary to the p-type FinFET's metal gate can increase a threshold voltage of the p-type FinFET. In some instances, the threshold voltage of the p-type FinFET is higher than a threshold voltage of a similarly configured p-type FinFET having a metal gate that does not border a metal gate of an n-type FinFET. Such n/p boundary effects are exacerbated as FinFET sizes continue to shrink.

The present disclosure thus proposes implementing a neutral zone (area) in a gate structure between the p-type FinFET's metal gate and the n-type FinFET's metal gate. For example, the present disclosure configures gate structure 130 with metal gate 230B disposed between metal gate 230A and metal gate 230C. Metal gate 230B is configured to eliminate (or impede) a metal diffusion path, such as an aluminum diffusion path, between metal gate 230A (in the depicted embodiment, the p-type FinFET's metal gate) and metal gate 230C (in the depicted embodiment, the n-type FinFET's metal gate). Metal gate 230B can thus be referred to as a metal diffusion barrier of gate structure 130. In the depicted embodiment, metal gate 230B blocks diffusion of n-type work function layer constituents between metal gate 230A and metal gate 230C. For example, because metal gate 230B does not include an n-type work function layer and p-type work function layers do not facilitate diffusion of n-type work function layer constituents, p-type work function layer 240B of metal gate 230B prevents n-type work function layer constituents from n-type work function layer 220C of metal gate 230C penetrating and/or diffusing into n-type work function layer 220A of metal gate 230B, and vice versa. Where the n-type work function layer constituents are aluminum, metal gate 230B acts as an aluminum diffusion barrier, blocking an aluminum diffusion path between metal gate 230A and metal gate 230C. Accordingly, metal gate 230B can significantly reduce n/p boundary effects, preventing undesired threshold voltage shifts of the p-type FinFET and/or the n-type FinFET of IC device 100. Different embodiments may have different advantages, and no particular advantage is necessarily required of any embodiment.

Figure 12:
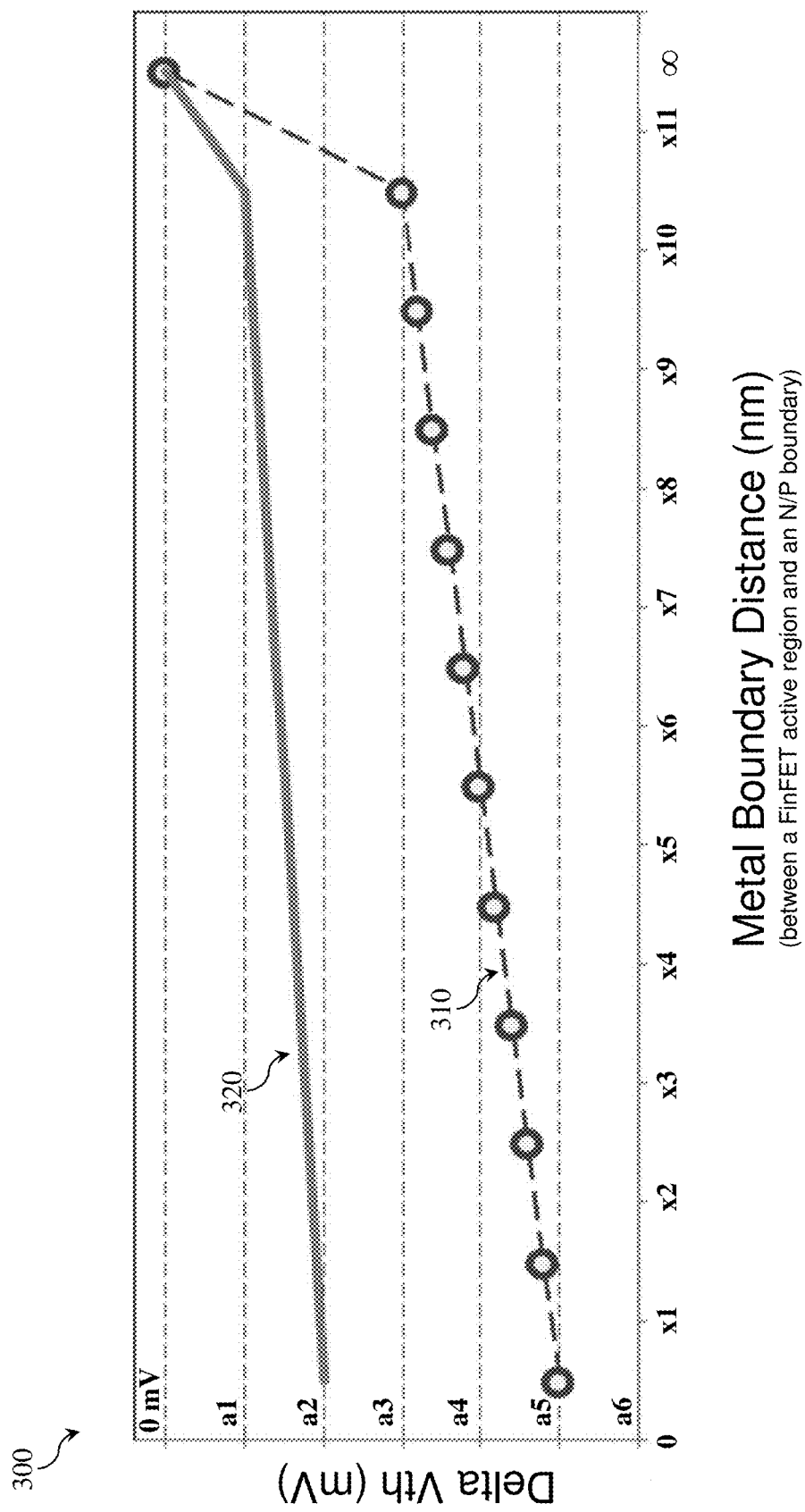
FIG. 12 is a graph that depicts threshold voltage shift as a function of a gate boundary distance according to according to various aspects of the present disclosure.

Such advantages are illustrated in FIG. 12, which includes a graph 300 that depicts a shift in threshold voltage in millivolts (mV) of a FinFET from a desired threshold voltage of the FinFET as a function of a distance in nanometers (nm) between a fin active region (in other words, a fin) of the FinFET and an n/p boundary of a metal gate of the FinFET. The shift in threshold voltage is represented from 0 mV (meaning the threshold voltage of the FinFET is the same as the desired threshold voltage of the FinFET) to a6 (a shift in threshold voltage that is greater than 0 mV), where a1, a2, a3, a4, and a5 represent shifts in threshold voltage in mV between 0 mV and a6. The distance is represented from 0 nm to infinity, where x1, x2, x3, x4, x5, x6, x7, x8, x9, x10, and x11 represent distances in nm between 0 nm and infinity. Curve 310 represents shifts in threshold voltage as a function of metal gate boundary distance of FinFETs having conventional metal gates, which include an n-type metal gate that shares an interface with a p-type metal gate. Curve 320 represents shifts in threshold voltage as a function of metal gate boundary distance of FinFETs having the proposed metal gates, which include a neutral gate disposed between an n-type metal gate and a p-type metal gate, such that the n-type metal gate does not share an interface with the p-type metal gate. In such instances, the metal boundary distance is measured between the fin active region and a middle (center) of the neutral gate that is disposed between the n-type metal gate and the p-type metal gate. From both curve 310 and curve 320, it is observed that shifts in threshold voltage from desired threshold voltages increase as metal gate boundary distances decrease. Since metal gate boundary distances shrink as FinFETs are scaled for advanced IC technology nodes, n/p boundary effects are thus more prevalent in such FinFETs. However, as illustrated by curve 320, configuring a portion of the metal gates as a neutral region (for example, metal gate 230B between metal gate 230A and metal gate 230C of gate structure 130) reduces shifts in threshold voltage from desired threshold voltages. The proposed gate structures can thus minimize threshold voltage variation in FinFETs from n/p boundary effects, thereby improving FinFET performance.

Turning again to FIGS. 11A-11D, in some implementations, though not depicted, gate trench 160 may not be completely filled in gate region 130-1 and gate region 130-3 after forming n-type work function layer 220. In such implementations, a metal fill (or bulk) layer is formed over n-type work function layer 220 before performing the planarization process. For example, an ALD process conformally deposits a metal fill layer on n-type work function layer 220, such that the metal fill layer has a substantially uniform thickness and fills any remaining portion of gate trench 160. The metal fill layer includes a suitable conductive material, such as Al, W, and/or Cu. The metal fill layer may additionally or collectively include other metals, metal oxides, metal nitrides, other suitable materials, or combinations thereof. In some implementations, a blocking layer is optionally formed over n-type work function layer 220 before forming the metal fill layer, such that the metal fill layer is disposed on the blocking layer. For example, an ALD process conformally deposits the blocking layer 184 on n-type work function layer 220, such that the blocking layer has a substantially uniform thickness and partially fills gate trench 160. The blocking layer includes a material that blocks and/or reduces diffusion between gate layers, such as the metal fill layer and n-type work function layer 220 and/or p-type work function layers 240A, 240B, 240C. Alternatively, the metal fill layer and/or the blocking layer are formed using another suitable deposition process, such as CVD, PVD, HDPCVD, MOCVD, RPCVD, PECVD, LPCVD, ALCVD, APCVD, spin coating, plating, other deposition process, or combinations thereof.

Fabrication can proceed to continue fabrication of IC device 100. For example, various contacts can be formed to facilitate operation of the p-type FinFET device in p-type FinFET region 116A and the n-type FinFET in n-type FinFET region 116B. For example, one or more ILD layers, similar to ILD layer 150, can be formed over substrate 110 (in particular, over ILD layer 150 and gate structure 130). Contacts can then be formed in ILD layer 150 and/or ILD layers disposed over ILD layer 150. For example, contacts are respectively electrically coupled with gate structure 130 and contacts are respectively electrically coupled to source/drain regions of the p-type FinFET and the n-type FinFET (particularly, epitaxial source/drain features 140A, 140B). Contacts include a conductive material, such as metal. Metals include aluminum, aluminum alloy (such as aluminum/silicon/copper alloy), copper, copper alloy, titanium, titanium nitride, tantalum, tantalum nitride, tungsten, polysilicon, metal silicide, other suitable metals, or combinations thereof. The metal silicide may include nickel silicide, cobalt silicide, tungsten silicide, tantalum silicide, titanium silicide, platinum silicide, erbium silicide, palladium silicide, or combinations thereof. In some implementations, ILD layers disposed over ILD layer 150 and the contacts (for example, extending through ILD layer 150 and/or the other ILD layers) are a portion of an MLI feature disposed over substrate 110, as described above. The MLI feature can include a combination of metal layers and ILD layers configured to form vertical interconnect features, such as contacts and/or vias, and/or horizontal interconnect features, such as lines. The various conductive features include materials similar to the contacts. In some implementations, a damascene process and/or dual damascene process is used to form the MLI feature.

Figure 13:
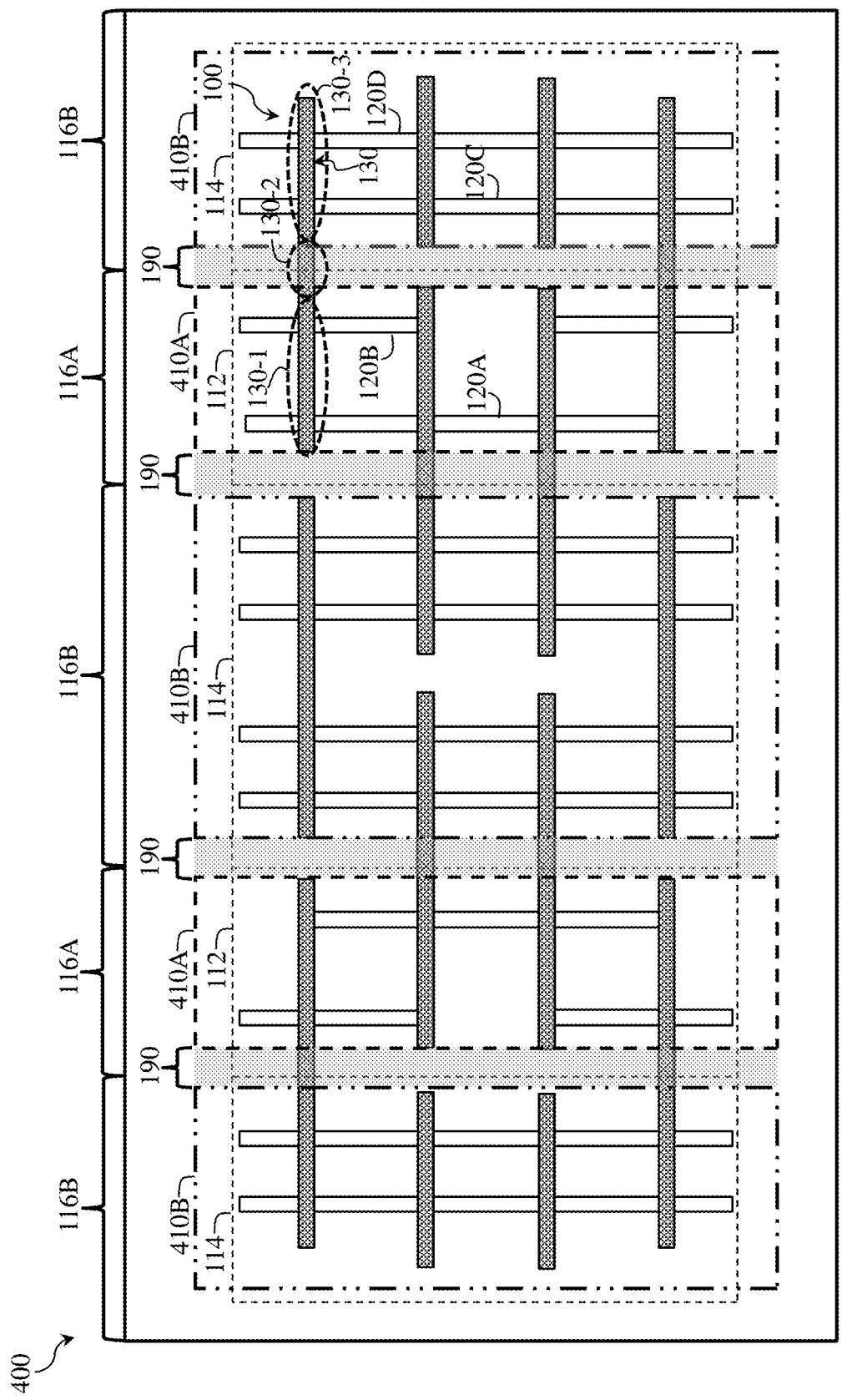
FIG. 13, FIG. 14, and FIG. 15 are fragmentary diagrammatic top views of a masking scheme that can be used in fabricating gate structures having neutral (or barrier) regions in an IC device, in portion or entirety, according to various aspects of the present disclosure.
Figure 14:
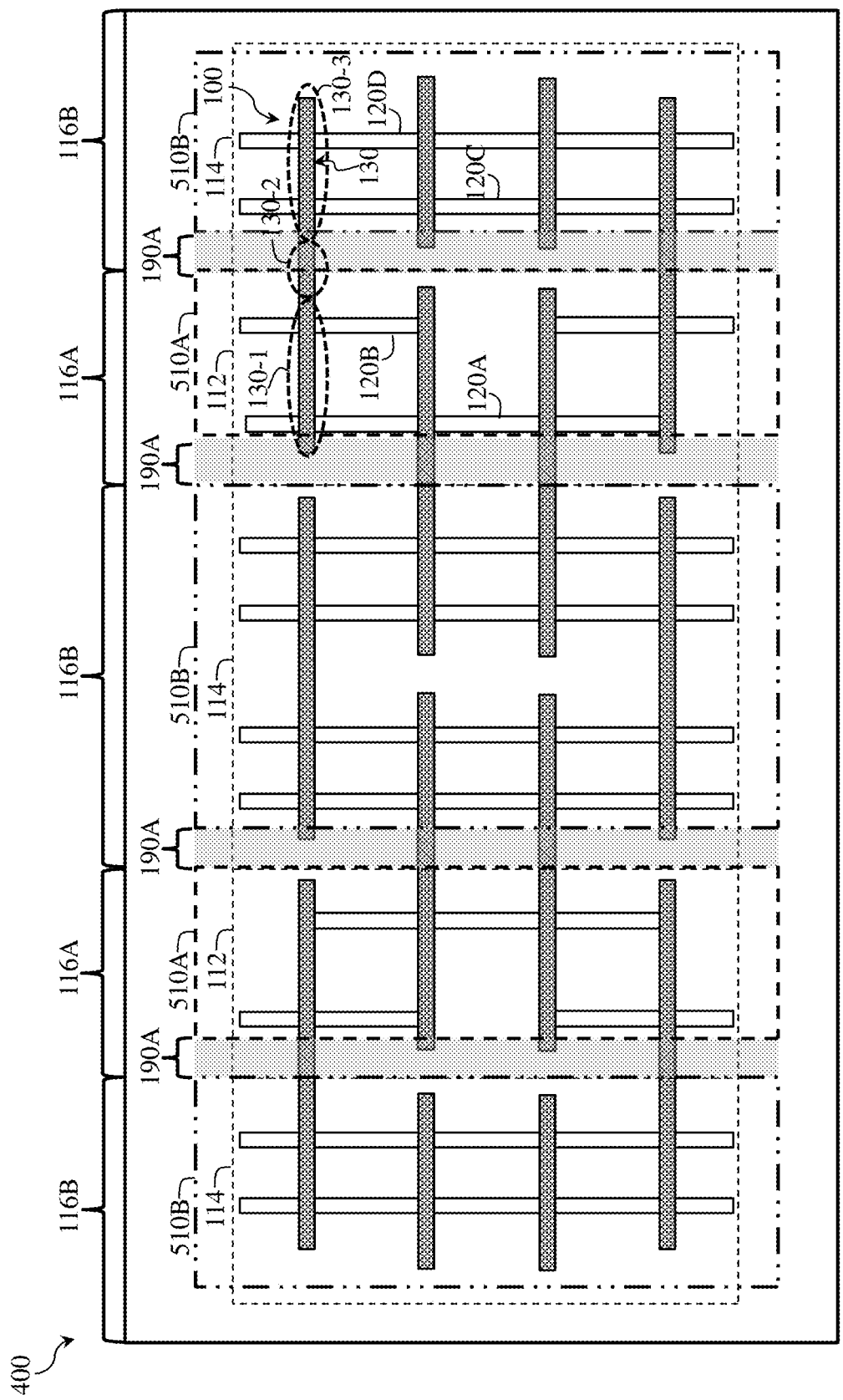
Figure 15:
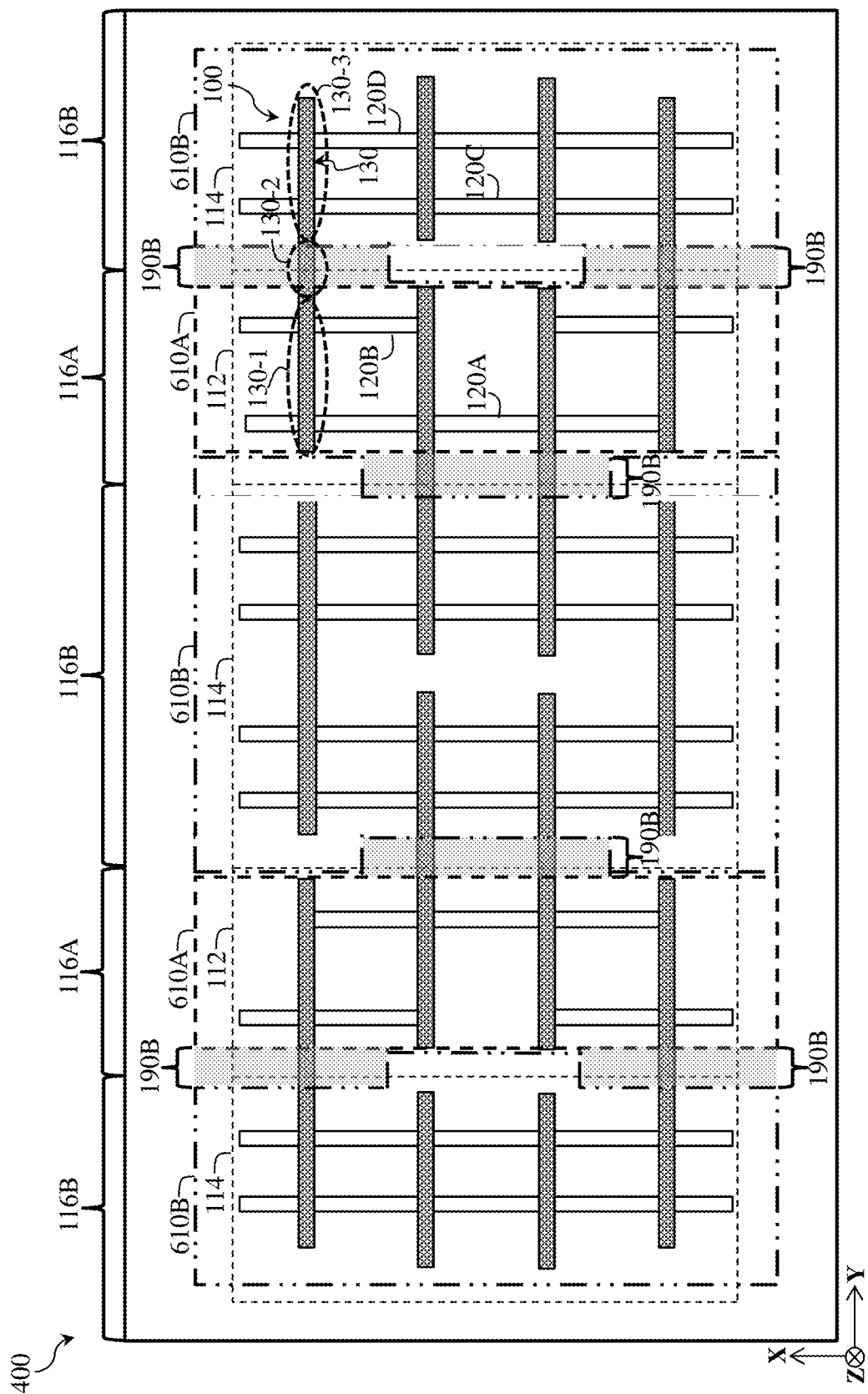

Fabrication of gate structure 130 implements a threshold voltage adjustment masking scheme that does not expose a portion of the gate structure configured as a metal diffusion barrier (such as metal gate 230B fabricated in gate region 130-2) between the p-type FinFET metal gate (metal gate 230A) and the n-type FinFET metal gate (metal gate 230C). FIG. 13, FIG. 14, and FIG. 15 are fragmentary diagrammatic top views of a masking scheme that can be used to fabricate gate structures having metal diffusion barrier regions in an IC device 300, in portion or entirety, according to various aspects of the present disclosure. IC device 300 includes IC device 100, along with other IC devices having gate structures that include both a p-metal gate for a p-type FinFET and a metal gate for an n-type FinFET. In FIGS. 13-15, openings to be formed by a threshold voltage adjustment mask are defined that can expose a p-type work function layer of a gate structure configured for a p-type FinFET and/or an n-type FinFET. A thickness of the exposed p-type work function layer can be adjusted to change an effective work function of its corresponding portion of the gate structure, thereby adjusting a threshold voltage of the p-type FinFET and/or the n-type FinFET. The openings are configured so that the p-type work function layer is not exposed in a region of a gate structure defined as a boundary between the p-type FinFET's metal gate and the n-type FinFET's metal gate. Accordingly, a region of a gate structure, such as gate region 130-2, is not exposed during threshold voltage adjustment operations and undergoes only deposition operations, such as those implemented to form a gate dielectric layer (here, gate dielectric layer 170B) and a p-type work function layer (here, p-type work function layer 240B). FIGS. 13-15 have been simplified for the sake of clarity to better understand the inventive concepts of the present disclosure. Additional features can be added in the masking schemes, and some of the features described below can be replaced, modified, or eliminated in other embodiments of the masking schemes.

Turning to FIG. 13, openings 410A correspond with openings to be formed in a masking layer by a p-type FinFET threshold voltage adjustment mask during an operation that removes or adjusts a thickness of a p-type work function layer in the p-type FinFET region. Openings 410B correspond with openings to be formed in a masking layer by an n-type FinFET threshold voltage adjustment mask during an operation that removes or adjusts a thickness of a p-type work function layer in the n-type FinFET region. In some implementations, openings 410A and openings 410B correspond with openings to be formed in a masking layer by a threshold voltage adjustment mask during an operation that removes or adjusts a thickness of a p-type work function layer in the p-type FinFET region and the n-type FinFET region (such as described with reference to FIGS. 8A-8D). Openings 410A are spaced from openings 410B by defined neutral regions 190 so openings 410A and openings 410B do not overlap or have edges aligned directly adjacent to one another. In FIG. 13, neutral regions 190 extend along entire lengths of openings 410A, 410B. Each neutral region 190 overlaps an interface between a respective doped well 112 and a respective doped well 114. In such configuration, openings 410A, 410B do not overlap or have edges aligned with the interfaces between doped wells 112 and doped wells 114. A width of each opening 410A is less than a width of a respective p-type FinFET region 116A defined by a respective doped well 112, and a width of each opening 410B is less than a width of a respective n-type FinFET region 116B defined by a respective doped well 114. Openings 410A and openings 410B are thus arranged to ensure that portions of gate structures spanning p-type FinFET regions 116A and n-type FinFET regions 116B, such as gate structure 130, are not exposed during threshold voltage adjustment operations that involve etching or removing work function layers. Neutral regions 190 define the portions of gate structures over which openings 410A, 410B should not overlap. In some implementations, a ratio of a width of openings 410B to a width of openings 410A to a width of neutral regions 190 is given by x:y:z, where x is the width of openings 410B, y is the width of openings 410A, and z is the width of neutral regions 190. In some implementations, x is about 3 to about 10, y is about 3 to about 10, and z is about 1. In some implementations, a critical (minimum) dimension of openings 410B is reduced to allow for neutral regions 190 and achieve the masking scheme illustrated in FIG. 13, which facilitates improved lithography overlay process windows.

Turning to FIG. 14, openings 510A correspond with openings to be formed in a masking layer by a p-type FinFET threshold voltage adjustment mask during an operation that removes or adjusts a thickness of a p-type work function layer in the p-type FinFET region. Openings 510B correspond with openings to be formed in a masking layer by an n-type FinFET threshold voltage adjustment mask during an operation that removes or adjusts a thickness of a p-type work function layer in the n-type FinFET region. In some implementations, openings 510A and openings 510B correspond with openings to be formed in a masking layer by a threshold voltage adjustment mask during an operation that removes or adjusts a thickness of a p-type work function layer in the p-type FinFET region and the n-type FinFET region (such as described with reference to FIGS. 8A-8D). Openings 510A are spaced from openings 510B by defined neutral regions 190A so openings 510A and openings 510B do not overlap or have edges aligned directly adjacent to one another. In FIG. 14, neutral regions 190A extend along entire lengths of openings 510A, 510B. In contrast to neutral regions 190, each neutral region 190A does not overlap an interface between a respective doped well 112 and a respective doped well 114. For example, neutral region 190A furthest to the left (a first neutral region) is disposed entirely over a first doped well 112 and has an edge aligned with a respective interface between the first doped well 112 and a first doped well 114. In furtherance of the example, neutral region 190 that is second furthest to the left (the second neutral region) is disposed entirely over a second doped well 114 and has an edge aligned with a respective interface between the second doped well 114 and the first doped well 112. In such configuration, each opening 510A has an edge aligned with an interface between a respective doped well 112 and a respective doped well 114. A width of each opening 510A is less than a width of a respective p-type FinFET region 116A defined by a respective doped well 112, and a width of each opening 510B is less than a width of a respective n-type FinFET region 116B defined by a respective doped well 114. Openings 510A and openings 510B are thus arranged to ensure that portions of gate structures spanning p-type FinFET regions 116A and n-type FinFET regions 116B, such as gate structure 130, are not exposed during threshold voltage adjustment operations that involve etching or removing work function layers. Neutral regions 190A define the portions of gate structures over which openings 510A, 510B should not overlap. In some implementations, a ratio of a width of openings 510B to a width of openings 510A to a width of neutral regions 190A is given by x:y:z, where x is the width of openings 510B, y is the width of openings 510A, and z is the width of neutral regions 190A. In some implementations, x is about 3 to about 10, y is about 3 to about 10, and z is about 1. In some implementations, a critical (minimum) dimension of openings 510B is reduced to allow for neutral regions 190A and achieve the masking scheme illustrated in FIG. 14, which facilitates improved lithography overlay process windows.

Turning to FIG. 15, openings 610A correspond with openings to be formed in a masking layer by a p-type FinFET threshold voltage adjustment mask during an operation that removes or adjusts a thickness of a p-type work function layer in the p-type FinFET region. Openings 610B correspond with openings to be formed in a masking layer by an n-type FinFET threshold voltage adjustment mask during an operation that removes or adjusts a thickness of a p-type work function layer in the n-type FinFET region. In some implementations, openings 610A and openings 610B correspond with openings to be formed in a masking layer by a threshold voltage adjustment mask during an operation that removes or adjusts a thickness of a p-type work function layer in the p-type FinFET region and the n-type FinFET region (such as described with reference to FIGS. 8A-8D). Openings 610A are spaced from openings 610B by defined neutral regions 190B so openings 610A and openings 610B do not overlap or have edges aligned directly adjacent to one another in locations where gate structures span p-type FinFET regions 116A and n-type FinFET regions 116B. In FIG. 15, each neutral region 190B overlaps an interface between a respective doped well 112 and a respective doped well 114. In contrast to neutral regions 190, neutral regions 190B do not extend along entire lengths of openings 610A, 610B. In such configuration, neutral regions 190B are not defined where gate structures are cut to provide gates respectively for p-type FinFET regions 116A and n-type FinFET regions 116B. Openings 610A and openings 610B thus overlap or have edges aligned therebetween in gate cut regions yet are still arranged to ensure that portions of gate structures spanning p-type FinFET regions 116A and n-type FinFET regions 116B, such as gate structure 130, are not exposed during threshold voltage adjustment operations that involve etching or removing work function layers. Neutral regions 190B define the portions of gate structures over which openings 610A, 610B should not overlap. In some implementations, a ratio of a width of openings 610B to a width of openings 610A to a width of neutral regions 190B is given by x:y:z, where x is the width of openings 610B, y is the width of openings 610A, and z is the width of neutral regions 190B. In some implementations, x is about 3 to about 10, y is about 3 to about 10, and z is about 1. In some implementations, a critical (minimum) dimension of openings 610B is reduced to allow for neutral regions 190B and achieve the masking scheme illustrated in FIG. 15, which facilitates improved lithography overlay process windows.

The present disclosure provides for many different embodiments. Gate fabrication techniques for integrated circuit devices, particularly for fin-like field effect transistor devices, are disclosed herein. The gate fabrication techniques and related gate structures disclosed herein may be implemented in any of a variety of device types. For example, aspects of the present disclosure may be implemented to form gate structures suitable for planar field-effect transistors (FETs), multi-gate transistors (planar or vertical), such as fin-like FET (FinFET) devices, gate-all-around (GAA) devices, omega-gate (Ω-gate) devices, or pi-gate (Π-gate) devices, as well as strained-semiconductor devices, silicon-on-insulator (SOI) devices, partially-depleted SOI devices, fully-depleted SOI devices, or other devices. The present disclosure contemplates that one of ordinary skill may recognize other integrated circuit devices that can benefit from the gate fabrication techniques and/or gate structures described herein.

An exemplary integrated circuit device includes a gate structure having a first portion configured for a first transistor having a first threshold voltage, a second portion configured for a second transistor having a second threshold voltage, and a third portion disposed between the first portion and the second portion. A configuration of the third portion is different than a configuration of the first portion and a configuration of the second portion. The configuration of the first portion is different than the configuration of the second portion. The configuration of the third portion blocks diffusion of metal constituents between the first portion and the second portion. In some implementations, the first transistor is a p-type FinFET and the second transistor is an n-type FinFET, wherein the first portion of the gate structure traverses a first fin of the p-type FinFET and the second portion of the gate structure traverses a second fin of the n-type FinFET. In some implementations, the third portion spans over an interface between an n-type well and a p-type well disposed in a substrate. In some implementations, the first portion and the second portion are each spaced a distance from the interface between the n-type well and the p-type well disposed in the substrate.

In some implementations, the first portion includes a first gate dielectric and a first gate electrode, the second portion includes a second gate dielectric and a second gate electrode; and the third portion includes a third gate dielectric and a third gate electrode. The first gate electrode, the second gate electrode, and the third gate electrode are different. In some implementations, the first gate electrode and the second gate electrode each include a first type metal layer and a second type metal layer, where a configuration of the first type metal layer and the second type metal layer in the first gate electrode is different than a configuration of the first type metal layer and the second type metal layer in the second gate electrode. In such implementations, the third gate electrode includes the first type metal layer and is free of the second type metal layer. In some implementations, the first type metal layer is a p-type metal layer and the second type metal layer is an n-type metal layer. In some implementations, the configuration of the first type metal layer and the second type metal layer in the first gate electrode includes the first type metal layer having a first thickness and the second type metal layer having a second thickness, and the configuration of the first type metal layer and the second type metal layer in the second gate electrode includes the first type metal layer having a third thickness and the second type metal layer having a fourth thickness. The third thickness is greater than the first thickness and the fourth thickness is less than the second thickness.

Another exemplary integrated circuit includes a metal gate that includes a first portion, a second portion, and a third portion, where the second portion is disposed between the first portion and the third portion. The first portion includes a first gate dielectric layer, a first p-type work function layer disposed over the first gate dielectric layer, and a first n-type work function layer disposed over the first p-type work function layer. The second portion includes a second gate dielectric layer and a second p-type work function layer disposed over the second gate dielectric layer. The third portion includes a third gate dielectric layer, a third p-type work function layer disposed over the third gate dielectric layer, and a second n-type work function layer disposed over the third p-type work function layer. The second p-type work function layer separates the first n-type work function layer from the second n-type work function layer, such that the first n-type work function layer does not share an interface with the second n-type work function layer. In some implementations, the second p-type work function layer shares an interface with the first p-type work function layer and the third p-type work function layer.

In some implementations, the first p-type work function layer, the second p-type work function layer, and the third p-type work function layer include titanium and nitrogen, and the first n-type work function layer and the second n-type work function layer include titanium and aluminum. In some implementations, a thickness of the first n-type work function layer is greater than a thickness of the second n-type work function layer. In some implementations, a thickness of the second p-type work function layer is greater than a thickness of the first p-type work function layer and a thickness of the third p-type work function layer. In some implementations, the thickness of the first p-type work function layer is less than the thickness of the third p-type work function layer.

An exemplary method includes removing a dummy gate to form a gate trench in a gate structure, wherein the gate trench spans a first transistor region that corresponds with a first transistor, a second transistor region that corresponds with a second transistor, and a boundary region disposed between the first transistor region and the second transistor region. The method further includes forming a gate dielectric layer in the gate trench in the first transistor region, the second transistor region, and the boundary region. The method further includes forming a p-type work function layer in the gate trench over the gate dielectric layer in the first transistor region, the second transistor region, and the boundary region, wherein the p-type work function layer has a first thickness in the first transistor region, a second thickness in the second transistor region, and a third thickness in the boundary region. The p-type work function layer and the gate dielectric layer fill the gate trench in the boundary region. The method further includes forming an n-type work function layer in the gate trench over the p-type work function layer in the first transistor region and the second transistor region.

In some implementations, the forming the p-type work function layer in the gate trench over the gate dielectric layer in the first transistor region, the second transistor region, and the boundary region includes depositing a first p-type work function layer over the gate dielectric layer in the first transistor region, the second transistor region, and the boundary region; removing the first p-type work function layer from the first transistor region; depositing a second p-type work function layer over the gate dielectric layer in the first transistor region, the first p-type work function layer in the second transistor region, and the p-type work function layer in the boundary region; removing the second p-type work function layer from the first transistor region and the second transistor region; and depositing a third p-type work function layer over the gate dielectric layer in the first transistor region, the first p-type work function layer in the second transistor region, and the second p-type work function layer in the boundary region.

In some implementations, the removing the first p-type work function layer from the first transistor region includes masking the second transistor region and the boundary region and etching the first p-type work function layer in the first transistor region. In some implementations, the removing the second p-type work function layer from the first transistor region and the second transistor region includes masking the boundary region and etching the first p-type work function layer in the first transistor region and the second transistor region. In some implementations, the forming the p-type work function layer includes depositing a first material that includes titanium and nitrogen and the forming the n-type work function layer includes depositing a second material that includes titanium and aluminum.

In some implementations, the forming the p-type work function layer in the gate trench over the gate dielectric layer in the first transistor region, the second transistor region, and the boundary region includes depositing the p-type work function layer to a fourth thickness over the gate dielectric layer in the first transistor region, the second transistor region, and the boundary region; etching back the p-type work function layer in the first transistor region to reduce the fourth thickness to the first thickness; and etching back the p-type work function layer in the second transistor region to reduce the fourth thickness to the third thickness. In some implementations, the boundary region is covered by a masking layer during the etching back the p-type work function layer in the first transistor region and the etching back the p-type work function layer in the second transistor region.

Yet another integrated circuit device includes a gate structure having a first portion configured for a first transistor having a first threshold voltage, a second portion configured for a second transistor having a second threshold voltage, and a third portion disposed between the first portion and the second portion. The third portion is configured to block metal diffusion between the first portion and the second portion. In some implementations, the first portion includes a first gate dielectric and a first gate electrode, the second portion includes a second gate dielectric and a second gate electrode, and the third portion includes a third gate dielectric and a third gate electrode. In such implementations, the first gate electrode, the second gate electrode, and the third gate electrode are different. In some implementations, the first gate dielectric, second gate dielectric, and third gate dielectric are the same. In some implementations, the first gate dielectric, second gate dielectric, and third gate dielectric are different. In some implementations, the first transistor is a p-type FinFET and the second transistor is an n-type FinFET, where the first portion of the gate structure traverses a first fin of the p-type FinFET and the second portion of the gate structure traverses a second fin of the n-type FinFET.

In some implementations, the first gate electrode and the second gate electrode each include a first type metal layer and a second type metal layer, wherein a first configuration of the first type metal layer and the second type metal layer in the first gate electrode is different than a second configuration of the first type metal layer and the second type metal layer in the second gate electrode. In such implementations, the third gate electrode includes the first type metal layer and is free of the second type metal layer. In some implementations, the first configuration includes the first type metal layer having a first thickness and the second type metal layer having a second thickness, and the second configuration includes the first type metal layer having a third thickness and the second type metal layer having a fourth thickness. The third thickness is greater than the first thickness and the fourth thickness is less than the second thickness.

In some implementations, the first type metal layer is a p-type metal layer and the second type metal layer is an n-type metal layer. In some implementations, the second type metal layer includes aluminum. In some implementations, a ratio of a width a first active region corresponding with the first transistor to a width of a second active region corresponding with the second transistor to a width of a neutral zone corresponding with an area disposed between the first active region and the second active region is given by x:y:z, wherein x is about 3 to about 10, y is about 3 to about 10, and z is about 1.

Yet another exemplary method includes forming a gate dielectric layer over a first transistor region that corresponds with a first transistor, a second transistor region that corresponds with a second transistor, and a boundary region disposed between the first transistor region and the second transistor region. The method further includes forming a first type metal layer over the gate dielectric layer in the first transistor region, the second transistor region, and the boundary region. The method further includes adjusting a thickness of the first type metal layer in the first transistor region and the second transistor region. The method further includes forming a second type metal layer over the first type metal layer in the first transistor region and the second transistor region. In some implementations, the forming the first type metal layer includes depositing a titanium-comprising metal layer. In some implementations, the forming the second type metal layer includes depositing an aluminum-comprising metal layer. In some implementations, the boundary region is not exposed by a mask during the adjusting the thickness of the first type metal layer in the first transistor region and the thickness of the first type metal layer in the second transistor region.

In some implementations, the adjusting the thickness of the first type metal layer in the first transistor region and the thickness of the first type metal layer in the second transistor region includes etching back the first type metal layer in the first transistor region and the second transistor region. In such implementations, the forming the second type metal layer includes depositing the second type metal layer over the etched back first type metal layer in the first transistor region and the etched back second type metal layer in the second transistor region. In some implementations, the etching back the first type metal layer in the first transistor region and the second transistor region includes reducing the thickness of the first type metal layer in the first transistor region to a first thickness and reducing the thickness of the first type metal layer in the second transistor region to a second thickness, wherein the second thickness is different than the first thickness. In some implementations, the etching back the first type metal layer in the first transistor region and the second transistor region includes masking the second transistor region and the boundary region during the etching back of the first type metal layer in the first transistor region and masking the first transistor region and the boundary region during the etching back of the first type metal layer in the second transistor region. In some implementations, the masking the second transistor region includes forming a first patterned masking layer that has a first opening that exposes the first type metal layer in the first transistor region, etching back the exposed first type metal layer, and removing the first patterned masking layer. In some implementations, the masking the first transistor region includes forming a second patterned masking layer that has a second opening that exposes the first type metal layer in the second transistor region, etching back the exposed first type metal layer in the second transistor region, and removing the second patterned masking layer.

In some implementations, the forming the first type metal layer includes filling a first gate trench that spans the first transistor region, the second transistor region, and the boundary region; the adjusting the thickness of the first type metal layer in the first transistor region and the thickness of the first type metal layer in the second transistor region includes forming a second gate trench in the first transistor region and the second transistor region; and the forming the second type metal layer includes filling the second gate trench in the first transistor region and the second transistor region. In some implementations, a width of the second gate trench in the first transistor region is greater than a width of the second gate trench in the second transistor region. In some implementations, the method includes forming the first gate trench by removing a dummy gate from a gate structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit device comprising:
a dielectric feature disposed in a substrate between a first active semiconductor region and a second active semiconductor region, wherein the first active semiconductor region and the second active semiconductor region extend lengthwise along a first direction, a spacing is between the first active semiconductor region and the second active semiconductor region along a second direction that is different than the first direction, and the dielectric feature spans the spacing from the first semiconductor active region to the second semiconductor active region; and
a gate structure extending lengthwise along the second direction over the first active semiconductor region, the dielectric feature, and the second active semiconductor region, wherein the gate structure has:
a first gate portion configured for a first transistor having a first threshold voltage, a second gate portion configured for a second transistor having a second threshold voltage, and a third gate portion disposed between and directly adjacent to the first gate portion and the second gate portion,
wherein the first gate portion is disposed over the first active semiconductor region and a first dielectric portion of the dielectric feature, the second gate portion is disposed over the second active semiconductor region and a second dielectric portion of the dielectric feature, the third gate portion is disposed over a third dielectric portion of the dielectric feature that is between the first dielectric portion of the dielectric feature and the second dielectric portion of the dielectric feature, and the third gate portion extends over the third dielectric portion of the dielectric feature from the first gate portion to the second gate portion, and
wherein a configuration of the third gate portion is different than a configuration of the first gate portion and a configuration of the second gate portion, the configuration of the first gate portion is different than the configuration of the second gate portion, and the configuration of the third gate portion blocks diffusion of metal constituents between the first gate portion and the second gate portion.

2. The integrated circuit device of claim 1, wherein:
the first gate portion and the gate second portion each include a first metal layer and a second metal layer;
the first gate portion includes a first gate dielectric and a first gate electrode that includes the first metal layer and the second metal layer;
the second gate portion includes a second gate dielectric and a second gate electrode that includes the first metal layer and the second metal layer; and
the third gate portion includes a third gate dielectric and a third gate electrode that includes the first metal layer, wherein the first gate electrode, the second gate electrode, and the third gate electrode are different.

3. The integrated circuit device of claim 2, wherein:
the first metal layer is a first type metal layer and the second metal layer is a second type metal layer, wherein a configuration of the first type metal layer and the second type metal layer in the first gate electrode is different than a configuration of the first type metal layer and the second type metal layer in the second gate electrode; and
the third gate electrode includes the first type metal layer and is free of the second type metal layer.

4. The integrated circuit device of claim 3, wherein:
the configuration of the first type metal layer and the second type metal layer in the first gate electrode includes the first type metal layer having a first thickness and the second type metal layer having a second thickness; and
the configuration of the first type metal layer and the second type metal layer in the second gate electrode includes the first type metal layer having a third thickness and the second type metal layer having a fourth thickness, wherein the third thickness is greater than the first thickness and the fourth thickness is less than the second thickness.

5. The integrated circuit device of claim 3, wherein the first type metal layer is a p-type metal layer and the second type metal layer is an n-type metal layer.

6. The integrated circuit device of claim 1, wherein the first transistor is a p-type FinFET and the second transistor is an n-type FinFET, wherein the first active semiconductor region is a first fin of the p-type FinFET and the second active semiconductor region is a second fin of the n-type FinFET.

7. The integrated circuit device of claim 1, wherein the dielectric feature is disposed between the substrate and the third gate portion and the third gate portion spans over an interface between an n-type well and a p-type well that are disposed in the substrate.

8. The integrated circuit device of claim 7, wherein the first gate portion and the second gate portion are each spaced a distance from the interface between the n-type well and the p-type well that are disposed in the substrate.

9. An integrated circuit comprising:
a metal gate that includes a first portion, a second portion, and a third portion, wherein the second portion is disposed between the first portion and the third portion, wherein:
the first portion includes a first gate dielectric layer, a first p-type work function layer disposed over the first gate dielectric layer, and a first n-type work function layer disposed over the first p-type work function layer,
the second portion includes a second gate dielectric layer and a second p-type work function layer disposed over the second gate dielectric layer, and
the third portion includes a third gate dielectric layer, a third p-type work function layer disposed over the third gate dielectric layer, and a second n-type work function layer disposed over the third p-type work function layer, and
the second p-type work function layer separates the first n-type work function layer from the second n-type work function layer, such that the first n-type work function layer does not share an interface with the second n-type work function layer.

10. The integrated circuit of claim 9, wherein:
the first p-type work function layer, the second p-type work function layer, and the third p-type work function layer include titanium and nitrogen; and
the first n-type work function layer and the second n-type work function layer include titanium and aluminum.

11. The integrated circuit of claim 9, wherein the second p-type work function layer shares an interface with the first p-type work function layer and the third p-type work function layer.

12. The integrated circuit of claim 9, wherein a thickness of the first n-type work function layer is greater than a thickness of the second n-type work function layer.

13. The integrated circuit of claim 9, wherein a thickness of the second p-type work function layer is greater than a thickness of the first p-type work function layer and a thickness of the third p-type work function layer.

14. The integrated circuit of claim 13, wherein the thickness of the first p-type work function layer is less than the thickness of the third p-type work function layer.

15. A device comprising:
a metal gate that spans a first transistor region, a second transistor region, and a boundary region between the first transistor region and the second transistor region, wherein the metal gate traverses a first channel region of a first fin in the first transistor region and a second channel region of a second fin in the second transistor region, and wherein the metal gate has:
a gate dielectric layer disposed in the first transistor region, the second transistor region, and the boundary region,
a first type work function layer disposed over the gate dielectric layer, wherein the first type work function layer has a first thickness in the first transistor region, a second thickness in the second transistor region, and a third thickness in the boundary region, wherein the third thickness is greater than the second thickness and the second thickness is greater than the first thickness,
a second type work function layer disposed over the first type work function layer, wherein the second type work function layer has a fourth thickness in the first transistor region and a fifth thickness in the second transistor region, wherein the fourth thickness is greater than the fifth thickness,
the gate dielectric layer and the first type work function layer extend continuously from the first transistor region to the second transistor region, and
the second type work function layer does not extend continuously from the first transistor region to the second transistor region; and
first source/drain features disposed over first source/drain regions of the first fin and second source/drain features disposed over second source/drain regions of the second fin, wherein the metal gate is disposed between the first source/drain features in the first transistor region and between the second source/drain features in the second transistor region.

16. The device of claim 15, wherein the metal gate is free of the second type work function layer in the boundary region.

17. The device of claim 15, wherein the boundary region is not disposed over a fin.

18. The device of claim 15, wherein the first type work function layer includes an aluminum-blocking constituent and the second type work function layer includes aluminum.

19. The device of claim 15, wherein the first type work function layer is a p-type metal layer and the second type work function layer is an n-type metal layer.

20. The device of claim 15, further comprising an isolation feature, wherein the metal gate in the boundary region covers a portion of the isolation feature.

21. An integrated circuit device comprising:
a gate structure having a first portion configured for a first transistor having a first threshold voltage, a second portion configured for a second transistor having a second threshold voltage, and a third portion disposed between the first portion and the second portion, wherein:
a configuration of the third portion is different than a configuration of the first portion and a configuration of the second portion, the configuration of the first portion is different than the configuration of the second portion, and the configuration of the third portion blocks diffusion of metal constituents between the first portion and the second portion,
the first portion includes a first gate dielectric and a first gate electrode, the second portion includes a second gate dielectric and a second gate electrode, and the third portion includes a third gate dielectric and a third gate electrode, wherein the first gate electrode, the second gate electrode, and the third gate electrode are different, the first gate electrode and the second gate electrode each include a first type metal layer and a second type metal layer, wherein a configuration of the first type metal layer and the second type metal layer in the first gate electrode is different than a configuration of the first type metal layer and the second type metal layer in the second gate electrode, and the third gate electrode includes the first type metal layer, and the third gate electrode is free of the second type metal layer.

\* \* \* \* \*